(12) United States Patent
Brown et al.

(10) Patent No.: US 7,070,419 B2
(45) Date of Patent: Jul. 4, 2006

(54) LAND GRID ARRAY CONNECTOR INCLUDING HETEROGENEOUS CONTACT ELEMENTS

(75) Inventors: Dirk D. Brown, Mountain View, CA (US); John D. Williams, Campbell, CA (US); Hongjun Yao, Sunnyvale, CA (US)

(73) Assignee: Neoconix Inc., Sunnyvale, CA (US)

( * ) Notice: Subject to any disclaimer, the term of this patent is extended or adjusted under 35 U.S.C. 154(b) by 168 days.

(21) Appl. No.: 10/854,600

(22) Filed: May 26, 2004

(65) Prior Publication Data

US 2004/0253846 A1 Dec. 16, 2004

Related U.S. Application Data

(62) Division of application No. 10/460,496, filed on Jun. 11, 2003, now abandoned.

(51) Int. Cl.
*H01R 12/00* (2006.01)

(52) U.S. Cl. .......................................... 439/66; 439/591
(58) Field of Classification Search .................. 439/66, 439/591, 70, 71, 91, 862
See application file for complete search history.

(56) References Cited

U.S. PATENT DOCUMENTS

| | | | |
|---|---|---|---|
| 3,543,587 A | * | 12/1970 | Kawada ..................... 74/5.6 C |
| 3,634,807 A | | 1/1972 | Grobe et al. |
| 4,998,885 A | | 3/1991 | Beaman |
| 5,199,879 A | | 4/1993 | Kohn et al. |
| 5,228,861 A | | 7/1993 | Grabbe |
| 5,257,950 A | | 11/1993 | Lenker et al. |

(Continued)

FOREIGN PATENT DOCUMENTS

| | | |
|---|---|---|
| EP | 0692823 A1 | 1/1996 |
| JP | 200011443 | 4/2000 |
| JP | 2001203435 | 7/2001 |
| WO | 9 602 068 | 1/1996 |
| WO | 9 744 859 | 11/1997 |
| WO | 0 213 253 | 2/2002 |

OTHER PUBLICATIONS

An article entitled "Patented Socketing System for the BGA/CSP Technology" by E–tec Interconnect Ltd., pp. 1–4.
Gary B. Kromann et al., "Motorola's PowerPC 603 and Power PC 604 RISC Microprocessor: the C4/Ceramic–ball–grid Array Interconnect Technology", Motorola Advanced Packaging Technology, Motorola, Inc., 1996, pp. 1–10.
Ravi Mahajan et al., "Emerging Directions for Packaging Technologies", Intel Technology Journal, V.6, Issue 02, May 16, 2002, pp. 62–75.

*Primary Examiner*—Tho D. Ta
*Assistant Examiner*—James R. Harvey
(74) *Attorney, Agent, or Firm*—Michael Bednarek; Pillsbury Winthrop Shaw Pittman LLP

(57) ABSTRACT

An electrical connector for electrically connecting to pads of a land grid array formed on an electronic component includes a dielectric layer including opposing first and second surfaces, and a multiple number of contact elements extending above the first surface of the dielectric layer. Each contact element includes a conductive portion disposed to engage a respective pad of the land grid array for providing electrical connection to the land grid array. In particular, the multiple number of contact elements includes a first contact element and a second contact element whereby the first contact element has an operating property different than an operating property of the second contact element. In one embodiment, the operating property includes a mechanical or an electrical property. For example, the first contact element can have a larger elasticity than the second contact element.

12 Claims, 23 Drawing Sheets

U.S. PATENT DOCUMENTS

| | | | |
|---|---|---|---|
| 5,358,411 A * | 10/1994 | Mroczkowski et al. ....... 439/66 |
| 5,468,655 A | 11/1995 | Greer |
| 5,532,612 A | 7/1996 | Liang |
| 5,593,903 A | 1/1997 | Beckenbaugh et al. |
| 5,632,631 A | 5/1997 | Fjelstad et al. |
| 5,772,451 A | 6/1998 | Dozier et al. |
| 5,802,699 A | 9/1998 | Fjelstad et al. |
| 5,812,378 A | 9/1998 | Fjelstad et al. |
| 5,842,273 A | 12/1998 | Schar |
| 5,860,585 A | 1/1999 | Rutledge et al. |
| 5,896,038 A | 4/1999 | Budnaitis et al. |
| 5,934,914 A | 8/1999 | Fjelstad et al. |
| 5,967,797 A | 10/1999 | Maldonado |
| 5,980,335 A * | 11/1999 | Barbieri et al. ............. 439/824 |
| 6,019,611 A | 2/2000 | McHugh et al. |
| 6,032,356 A * | 3/2000 | Eldridge et al. .............. 29/843 |
| 6,063,640 A | 5/2000 | Mizukoshi et al. |
| 6,133,534 A | 10/2000 | Fukutomi et al. |
| 6,156,484 A | 12/2000 | Bassous et al. |
| 6,184,699 B1 | 2/2001 | Smith et al. |
| 6,200,143 B1 | 3/2001 | Haba et al. |
| 6,204,065 B1 | 3/2001 | Ochiai |
| 6,205,660 B1 | 3/2001 | Fjelstad et al. |
| 6,208,157 B1 | 3/2001 | Akram et al. |
| 6,224,392 B1 | 5/2001 | Fasano et al. |
| 6,264,477 B1 | 7/2001 | Smith et al. |
| 6,293,808 B1 | 9/2001 | Ochiai |
| 6,298,552 B1 | 10/2001 | Li |
| 6,335,210 B1 | 1/2002 | Farooq et al. |
| 6,336,269 B1 | 1/2002 | Eldridge et al. |
| 6,337,575 B1 | 1/2002 | Akram |
| 6,373,267 B1 | 4/2002 | Hiroi |
| 6,374,487 B1 | 4/2002 | Haba et al. |
| 6,392,524 B1 | 5/2002 | Flick |
| 6,420,661 B1 | 7/2002 | Di Stefano et al. |
| 6,420,789 B1 | 7/2002 | Tay et al. |
| 6,420,884 B1 | 7/2002 | Khoury et al. |
| 6,428,328 B1 | 8/2002 | Haba et al. |
| 6,437,591 B1 | 8/2002 | Farnworth et al. |
| 6,442,039 B1 * | 8/2002 | Schreiber .................... 361/760 |
| 6,461,892 B1 | 10/2002 | Beroz |
| 6,474,997 B1 | 11/2002 | Ochiai |
| 6,492,251 B1 | 12/2002 | Haba et al. |
| 6,551,112 B1 | 4/2003 | Li et al. |
| 6,616,966 B1 | 9/2003 | Mathieu et al. |
| 6,640,432 B1 | 11/2003 | Mathieu et al. |
| 6,671,947 B1 | 1/2004 | Bohr |
| 6,719,569 B1 * | 4/2004 | Ochiai ........................ 439/66 |
| 2002/0011859 A1 | 1/2002 | Smith et al. |
| 2002/0058356 A1 | 5/2002 | Oya |
| 2002/0079120 A1 | 6/2002 | Eskildsen et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0179331 A1 | 12/2002 | Brodsky et al. |
| 2003/0089936 A1 | 5/2003 | McCormack et al. |
| 2003/0096512 A1 | 5/2003 | Cornell |
| 2003/0099097 A1 | 5/2003 | Mok et al. |
| 2003/0147197 A1 | 8/2003 | Uriu et al. |
| 2003/0194832 A1 | 10/2003 | Lopata et al. |

* cited by examiner

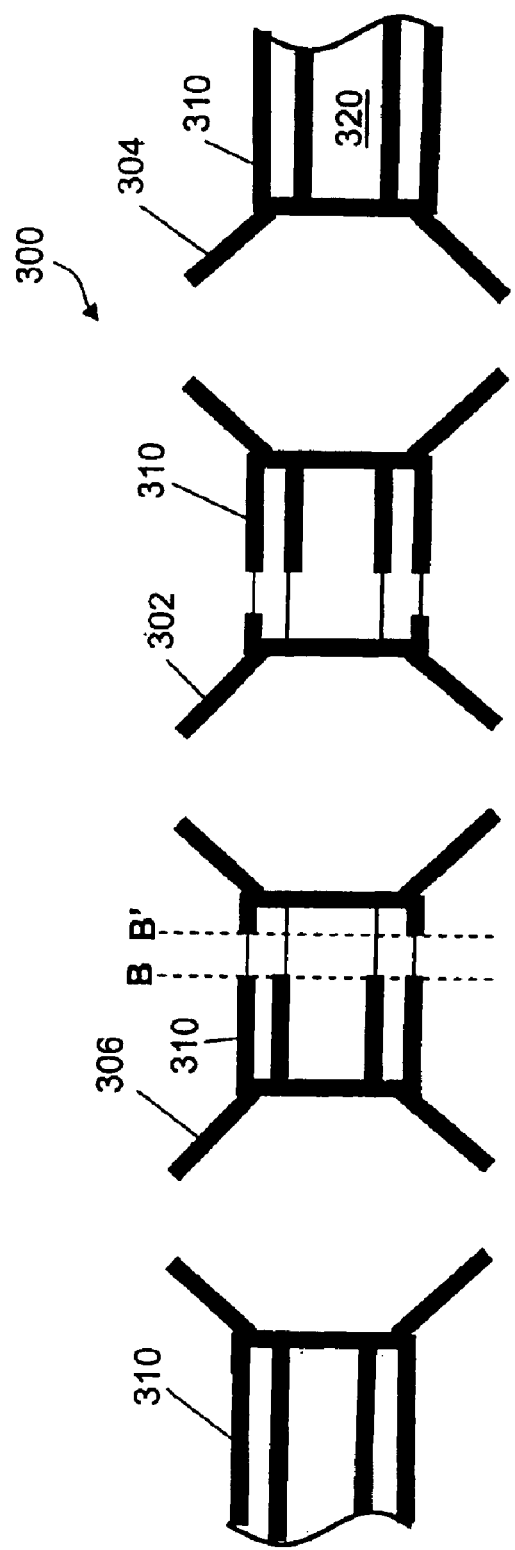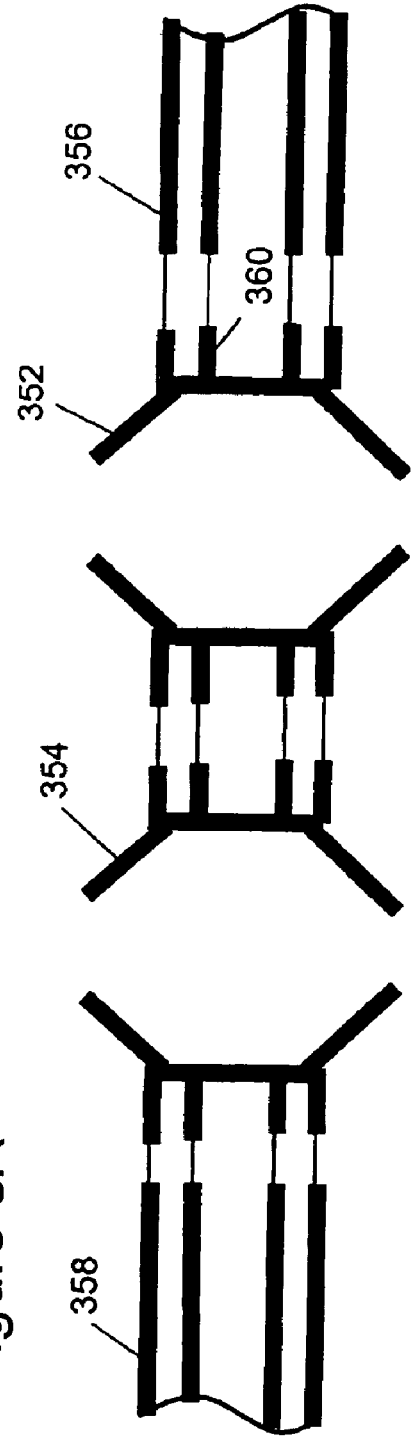
Figure 8A
Figure 8B

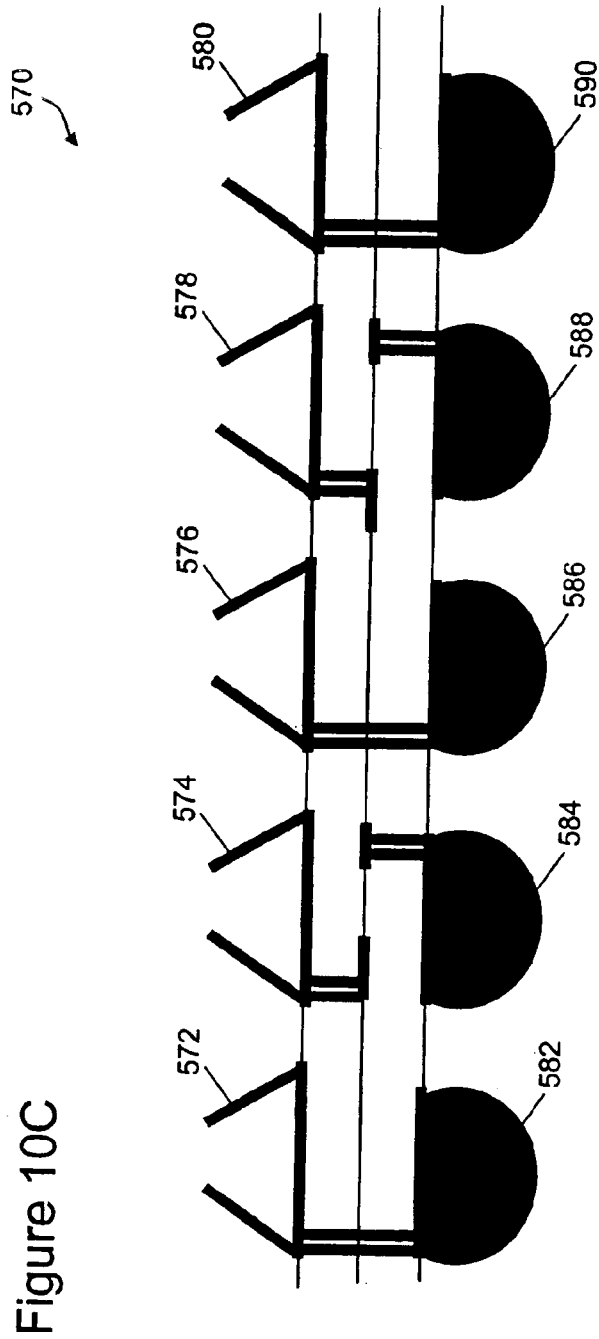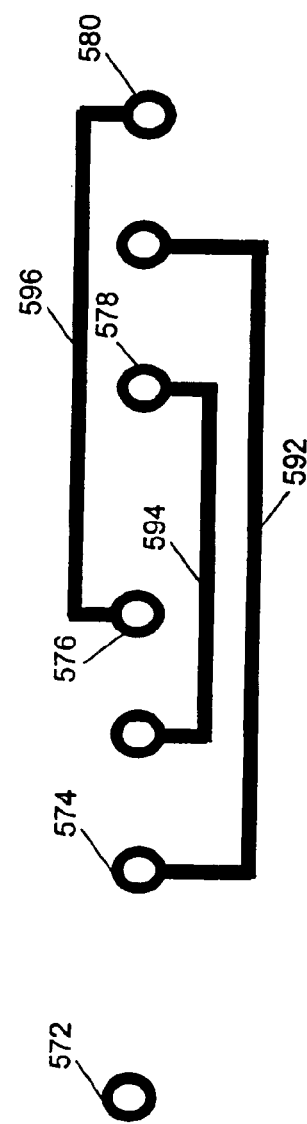
Figure 10C
Figure 10D

LAND GRID ARRAY CONNECTOR INCLUDING HETEROGENEOUS CONTACT ELEMENTS

CROSS-REFERENCE TO RELATED APPLICATIONS

This application is a divisional of U.S. application Ser. No. 10/460,496, filed Jun. 11, 2003, now abandoned, and is related to the following copending and commonly assigned U.S. patent applications: U.S. patent application Ser. No. 10/412,729, entitled "Contact Grid Array System," of John D. Williams et al., filed on Apr. 11, 2003. This application is also related to the following commonly assigned U.S. patent applications: U.S. patent application Ser. No. 10/460,501, filed Jun. 11, 2003, entitled "Remountable Connector for Land Grid Array Packages," of Dirk D. Brown et al.; U.S. patent application Ser. No. 10/460,504, filed Jun. 11, 2003, entitled "Circuitized Connector for Land Grid Array," of Dirk D. Brown et al.; and U.S. patent application Ser. No. 10/460,497, filed Jun. 11, 2003 entitled "Contact Grid Array Formed On A Printed Circuit Board," of Dirk D. Brown et al. The aforementioned patent applications are incorporated herein by reference in their entireties.

FIELD OF THE INVENTION

The invention relates to reconnectable, remountable electrical interconnects for LGA components and, in particular, to an LGA connector including heterogeneous contact elements, that is, contact elements having different operating properties.

DESCRIPTION OF THE RELATED ART

Electrical interconnects or connectors are used to connect two or more electronic components together or to connect an electronic component to a piece of electrical equipment, such as a tester. For instance, an electrical interconnect is typically used to connect an electronic component, such as an integrated circuit (an IC or a chip), to a printed circuit broad. An electrical interconnect is also used during integrated circuit manufacturing for connecting an IC device under test to a test system. In some applications, the electrical interconnect or connector provides separable or remountable connection so that the electronic component attached thereto can be removed and reattached. For example, it may be desirable to mount a packaged microprocessor chip to a personal computer mother board using a separable interconnect device so that malfunctioning chips can be readily removed or upgraded chips can be readily installed.

Conventional electrical connectors are usually made of stamped metal springs, which are formed and then individually inserted into an insulating carrier to form an array of electrical connection elements. Other approaches to making electrical connectors include using isotropically conductive adhesives, injection molded conductive adhesives, bundled wire conductive elements, and small solid pieces of metal.

Land grid array (LGA) refers to an array of metal pads (also called lands) that are used as the electrical contact points for an integrated circuit package, a printed circuit board, or other electronic component. The metal pads are usually formed using thin film deposition techniques and coated with gold to provide a non-oxidizing surface. LGA packages are typically cheaper to manufacture than ball grid array (BGA) packages because there is no need to form solder balls or solder bumps. However, LGA packages are typically more difficult to assemble onto a PC board or a multi-chip module. LGA connectors are usually used to provide removable and remountable socketing capability for LGA packages to PC boards or chip modules.

Advances in electronic device packaging technology has led to shrinking package geometries and increasing lead count. That is, the spacing (or the pitch) between each component electrical connection (also referred to as a "lead") on an electronic device is decreasing, while the total number of connections is increasing. For example, existing IC packages may be built with a pitch of 1 mm or less with 600 or more connections. Furthermore, IC devices are designed to be operated at increasingly higher frequencies. For example, IC devices for use in telecommunication and networking applications can be operated at a frequency of over 1 GHz. The operating frequencies of the electronic devices, the package size and lead count of the device packages place stringent requirements on the interconnect systems used to test or connect these electronic devices.

In particular, the mechanical, electrical and reliability performance criteria of an interconnect system are becoming increasingly demanding. Conventional interconnect technologies have not been able to meet all of the mechanical, electrical and reliability requirements for use with high speed, small dimension and large pin count IC devices. In general, conventional connector systems optimized for electrical performance have poor mechanical and reliability properties, while connector systems optimized for mechanical performance and improved reliability have poor electrical characteristics.

A particular problem encountered by today's interconnect systems is the variation in coplanarity and positional misalignment of the leads in the electronic components to be connected. In a conventional LGA package, the pads (the leads) of the package can become non-coplanar due to substrate warpage. The vertical offset between the pads in the array is often referred to as coplanarity variations. When the amount of vertical offset exceeds the coplanarity tolerance of a LGA connector, some of the pads may not be able to make electrical connection to the connector at all. Coplanarity variations of the pads of an LGA component make it difficult to make high quality and reliable electrical connections to all the leads of the electronic component.

Moreover, the location of the leads may also deviate from their predefined ideal position due to manufacturing limitations, resulting in positional misalignment. An effective interconnect must accommodate the horizontal positional variations of the leads of the electronic components to be connected. To make matters worse, the positional deviation of a lead relative to the lead size itself, due to either coplanarity variations or positional misalignments or both, on an electronic device from its ideal location increases as the size of the package decreases.

Coplanarity problems are not limited to IC packages but may also be exist in the printed circuit board (PC board) to which these IC packages are attached. Coplanarity problems may exist for LGA pads formed as an area array on a PC board due to warpage of the PC board substrate. Typically deviation from flatness in a conventional PC board is on the order of 75 to 125 microns or more per inch.

While LGA connectors can be effectively used to electrically connect an LGA package to printed circuit boards or modules, providing high density, high performance interconnections, the connector interface between the connector and the component to be connected are subject to potential reliability degradation. For instance, corrosive materials or particulate debris can enter the interface area, preventing proper electrical connection to be made. Also, the repeated mating or separation and remating of an LGA package may degrade the LGA connector, causing intermittent connection conditions and inhibit reliable electrical connection.

As a result, a connector for connecting the LGA packages to the printed circuit boards or modules must be able to meet the mechanical, electrical and reliability requirements of today's small geometry and large lead count packages. In particular, an LGA connector must be capable of accommodating the coplanarity variations of the LGA package and/or the printed circuit board. Otherwise, the connector cannot make acceptable and reliable connection to the electronic components. Conventional interconnect devices, such as stamped metal springs, bundled wire, and injection molded conductive adhesives, become very stiff and very difficult to manufacture as the dimensions are scaled down, rendering them unsuitable even for accommodating electronic components with normal positional variations. This is particularly true when the spacing between the contacts scales below 1 mm where the electrical path length requirement also scales to below 1 mm to minimize inductance and meet high frequency performance requirement. In this size regime, existing interconnect technologies become even more stiff and less elastic and cannot accommodate normal variations in system coplanarity and positional misalignments with a reasonable insertion force of about 30 to 40 grams per contact.

U.S. Pat. No. 5,199,879 discloses an electrical assembly wherein a conductive pin projecting from one circuit member is electrically engaged by one or more flexible portion of a circuitized element in a second circuit member. The flexible portions, in the shape of tabs, include a conductor layer formed on a dielectric layer. Because the electrical assembly of the instant patent is used for making electrical connection to pins having a long electrical contact length, any variations in coplanarity can be accommodated by the length of the pins. The tabs of the electrical assembly are not suitable for use in other electronic device package types, such as LGA packages, where accommodation for coplanarity variations is critical.

It is desirable to provide an electrical interconnect system which can accommodate normal positional tolerances, such as coplanarity variations and positional misalignments, in electronic components to be connected. Furthermore, it is desirable to provide an electrical interconnect system adapted for use with small geometry, high lead density electronic devices operating at high frequencies.

SUMMARY OF THE INVENTION

According to one embodiment of the present invention, a connector for electrically connecting to pads of a land grid array formed on an electronic component includes a dielectric layer including opposing first and second surfaces, and a multiple number of contact elements extending above the first surface of the dielectric layer. Each contact element includes a conductive portion disposed to engage a respective pad of the land grid array for providing electrical connection to the land grid array. In particular, the multiple number of contact elements includes a first contact element and a second contact element whereby the first contact element has an operating property different than an operating property of the second contact element. In one embodiment, the operating property includes a mechanical or an electrical property.

In another embodiment, the contact elements are selected from the group of contact types including metal springs, bundled wires, metal in polymer, and solid metal tabs. Furthermore, in other embodiments, the multiple number of contact elements can include different contact types. In yet another embodiment, a contact element in the multiple number of contact elements includes a base portion of conductive material and an elastic portion of conductive material formed integrally with the base portion. The elastic portion extends from the base portion and protrudes above the first surface of the dielectric layer. Each elastic portion of the multiple number of contact elements elastically engages a respective pad of the land grid array for providing electrical connection to the land grid array and has an elastic working range on the order of the electrical path length of the contact element.

The present invention is better understood upon consideration of the detailed description below and the accompanying drawings.

BRIEF DESCRIPTION OF THE DRAWINGS

FIGS. 8A and 8B are cross-section view of connectors including ground planes for improving signal integrity and for controlling contact element impedance.

FIG. 10C illustrates another embodiment of a circuitized connector in accordance with the present invention.

FIG. 10D is a top view of the electrical circuit formed in the dielectric substrate of the connector of FIG. 10C.

DETAILED DESCRIPTION OF THE PREFERRED EMBODIMENTS

Figure 1:
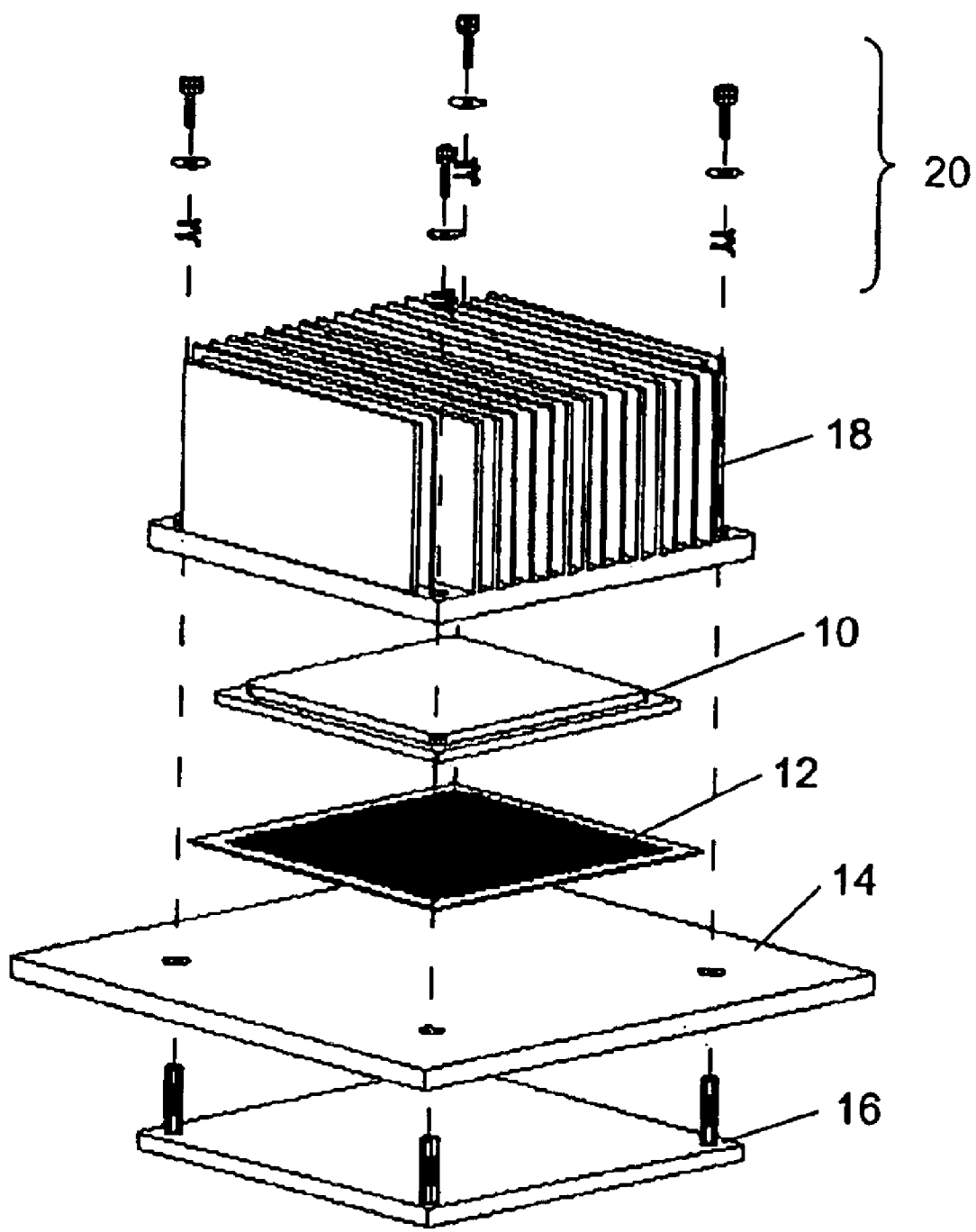
FIG. 1 is a cross-sectional view of an integrated circuit assembly incorporating an LGA connector according to one embodiment of the present invention.

In accordance with the principles of the present invention, a connector for a land grid array (LGA) package or area array includes an array of contact elements formed on a dielectric substrate where each contact element includes an elastic portion having an elastic working range on the order of the electrical path length of the contact element. The large elastic working range of the LGA connector of the present invention allows the connector to accommodate coplanarity deviations or positional misalignment that may be present in most electronic components to be connected, thereby providing high quality and reliable electrical connection between electronic components. The connector of the present invention provides separable or remountable connection and is capable of retaining high quality electrical connection over repeated insertions. In one embodiment, the contact element is formed as metal flanges extending from a ring-shaped base.

The connector of the present invention provides numerous advantages over conventional systems. First, the connector of the present invention is scalable in both pitch and height to less than 1 mm and is therefore suitable for use with electronic components packaged with small lead geometries and large lead count packages.

Second, the connector of the present invention is capable of accommodating normal variations in coplanarity and positional misalignment of the electronic component to be connected while still meeting the mechanical, electrical, and reliability requirements of connectors for use with small lead geometries and large lead count electronic components. Specifically, the contact elements of the connector of the present invention are capable of maintaining elasticity over a range that accommodates positional tolerances in most applications, even for lead pitches of 1 mm or less. For instance, in one embodiment of the present invention, the connector of the present invention is capable of providing a mechanical working range of more than 200 microns with an insertion force of 40 grams or less per contact. Thus, the connector of the present invention can accommodate coplanarity variations and positional misalignments on the order of 200 microns or more while maintaining a relatively low insertion force (40 grams or less per contact). Conventional connector technologies thus far have not been able to accommodate coplanarity variations while still provide satisfactory mechanical or electrical or reliability properties.

Third, the connector of the present invention is capable of achieving good signal integrity at frequencies above 1 GHz. Furthermore, the connector can meet high frequency performance requirement even when the spacing between contact elements is on the order of 1 mm or less.

Fourth, the connector of the present invention can be adapted for a wide variety of applications. For instance, the connector can be used to connect an LGA package to a PC board. The connector can also be used to connect between LGA area arrays on two PC boards. Basically, the connector of the present invention can be used to connect to LGA pads formed on any electronic components, such as on an LGA package, on a multi-chip module or on a PC board. As will be described in more detail below, the connector of the present invention can be formed by providing contact elements on one side of the connector only. The other side of the connector can be formed by providing pins, solder balls or other conventional connection mechanism. The connector of the present invention can also be formed by providing contact elements on both side of the connector so that the connector can be used to mate two LGA packages together or provide separable connection of an LGA package to pads on a PC board.

In the present description, an electrical interconnect or a connector refers to a device for connecting two electronic components together, such as an IC chip to a PC board, or for connecting an electronic component to an equipment, such as a tester. In the present description, the term "electrical interconnect" or "electrical connector" will be used interchangeably to refer to the connector of the present invention for connecting to an electronic component using LGA pads for leads. An electrical interconnect system or an electrical connector, as described herein, can be used for electrically connecting two or more electronic components together or for electrically connecting an electronic component to a piece of equipment. The electronic components can include integrated circuit (IC) or chips, printed circuit boards or multi-chip modules. In the case of an LGA formed on a PC board, the LGA is sometimes referred to as an area array. The equipment can include test equipment such as an electrical tester. Furthermore, in the present description, the term "lead" will be used collectively to refer to the electrical connections on the electronic components for making electrical contact with circuitry on or within the electronic components. Thus, the leads of an electronic component can include, but are not limited to, the pads of a land-grid array package or the pads on a printed circuit board.

Furthermore, while in the present description, the connector of the present invention is sometimes referred to as an LGA connector, it is understood that the connector of the present invention can be used with any electronic components including pads or "lands" as the electrical connection. The use of the term "LGA connector" is illustrative only and is not intended to limit the present invention to be used with LGA packages only.

FIG. 1 is a cross-sectional view of an integrated circuit assembly incorporating an LGA connector according to one embodiment of the present invention. FIG. 1 illustrates one application in which the LGA connector of the present invention can be advantageously applied. Referring to FIG. 1, an LGA connector 12 is used to connect an LGA package 10 to a PC board 14. The integrated circuit assembly can be secured by a bolster plate 16 and hardware 20 which provide compressive force between the LGA package and the PC board. A heat sink 18 is sometimes included and placed on the top of LGA package 10 to provide heat dissipation for the integrated circuit chip in the LGA package.

Figure 2A:
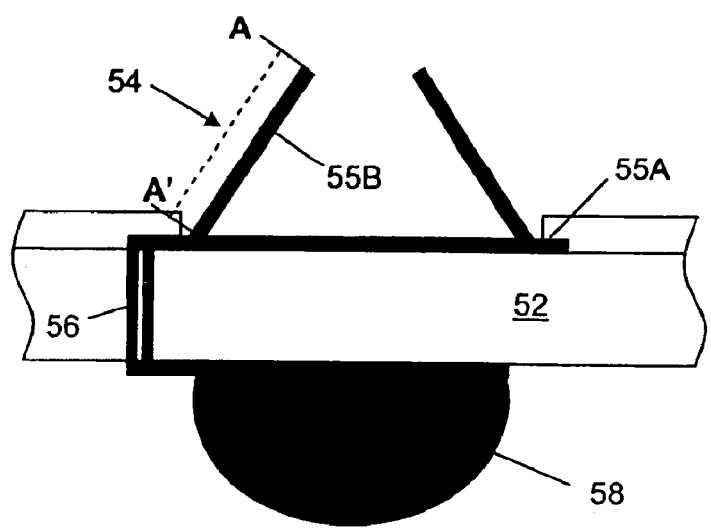
FIG. 2A is a cross-sectional view of a connector according to one embodiment of the present invention.
Figure 2B:
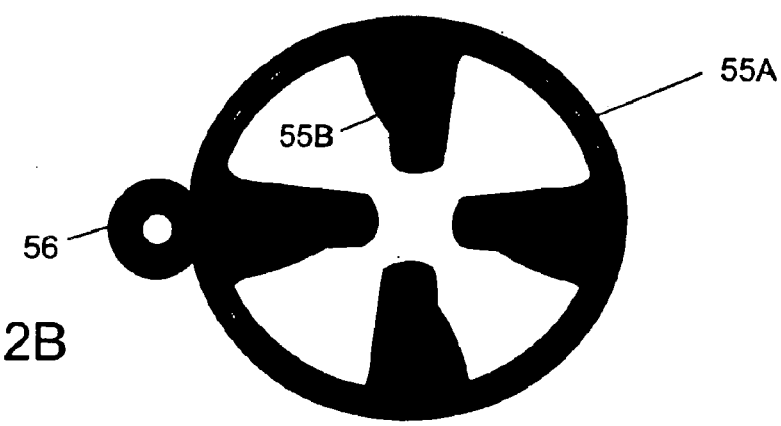
FIG. 2B is a top view of a contact element in the connector of FIG. 2A.

FIG. 2A is a cross-sectional view of a connector according to one embodiment of the present invention. FIG. 2B is a top view of a contact element in the connector of FIG. 2A. Referring to FIG. 2A, connector 50 includes a substrate 52 made of a dielectric material. In one embodiment, the substrate is a dielectric layer made of FR-4 or polyimide. In FIG. 2A, connector 50 is shown with a single contact element 54 built on the top surface of substrate 52. In most applications, connector 50 will include multiple number of contact elements 54 arrayed on the top surface of the substrate. The number and arrangement of contact elements are selected based on the electronic component to which the connector is to be connected.

Contact element 54 is formed using a conductive metal and includes a base portion 55A and one or more elastic portions 55B. In the present embodiment, base portion 55A is formed in a the shape of a ring (FIG. 2B) and elastic portions 55B are formed as flanges extending inwardly from base portion 55A. Furthermore, elastic portions 55B are formed protruding above base portion 55A and substrate 52. In operation, elastic portions 55B are compressed against a pad of an electronic component to be connected to provide electrical connection to the electronic component. In FIG. 2A, base portion 55A of contact element 54 is formed on the top surface of substrate 52 and embedded underneath a dielectric layer. In other embodiments, base portion 55A can be formed directly on the top surface of substrate 52 as well.

Contact element 54 is formed using a conductive metal that can provide the desired elasticity. For example, contact element 54 can be formed using a copper-alloy (Cu-alloy) or a multilayer metal sheet such as stainless steel coated with Copper-Nickel-Gold (Cu/Ni/Au) multilayer metal sheet. In a preferred embodiment, the contact elements are formed using a small-grained copper-beryllium (CuBe) alloy.

In the embodiment shown in FIG. 2A, each contact element 54 is coupled to a corresponding terminal 58 on the bottom surface of substrate 52. A via 56 is formed in substrate 52 and includes a conductive line electrically connecting contact element 54 and terminal 58. In the present embodiment, via 56 is formed adjacent contact element 54 and is connected to base portion 55A of the contact element as shown in FIG. 2B. Terminal 58 can be formed as any type of electrical connection. In the present embodiment, terminal 58 is formed as a solder ball. Connector 50 thus can be used as an interconnect between an LGA package and a PC board where the solder ball of terminal 58 can be bonded to a pad on the PC board. Terminal 58 can also be formed as pins or other contact structure, currently available or to be developed. The exact configuration of terminal 58 and via 56 is not critical to the practice of the present invention. According to an alternate embodiment of the present invention to be described in more detail below, terminal 58 can be formed using a second set of contact elements 54 so that the connector thus formed can be used to separably connect between pads of two LGA electronic components.

Furthermore, in FIG. 2A, terminal 58 is shown as being formed in vertical alignment with contact element 54. This configuration is illustrative only and terminal 58 may be formed in any position relative to contact element 54 depending on the application. For example, terminal 58 may be formed in an offset position from contact element 54. The exact location or placement of terminal 58 relative to contact element 54 is not critical to the connector of the present invention.

Figure 2C:
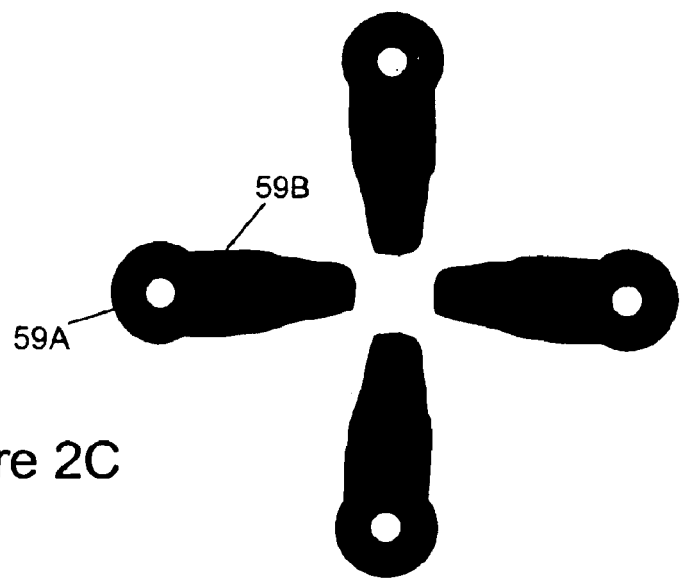
FIG. 2C is a top view of a contact element according to another embodiment of the present invention.

In the embodiment shown in FIG. 2B, contact element 54 is formed as including a ring-shaped base portion and four elastic portions. The contact element is coupled to terminal 58 through via 56. In the present embodiment, the base portion is formed as a contiguous ring connecting the four elastic portions to via 56. This configuration is illustrative only and is not intended to be limiting. The contact element of the present invention can be formed in a variety of configurations and each contact element only needs to have a base portion sufficient for attaching the elastic portion to the dielectric substrate. The base portion can assume any shape and does not have to be in the form of a closed circle. Thus, in an alternate embodiment of the present invention shown in FIG. 2C, a contact element includes a base portion 59A and an elastic portion 59B extending from the base portion. A via can be formed in the base portion of the contact element for connecting the contact element to the respective terminal on the other side of the dielectric substrate. Furthermore, a contact element can include multiple separate base and elastic portions as shown in FIG. 2C. Although each of the base and elastic portions in the contact element are isolated from each other, they can be connected by metal traces in the dielectric substrate so that all base and elastic portions associated with one contact element are connected to a single terminal.

In accordance with the present invention, the elastic portion of the contact element has a large elastic working range so that the elastic portion operates entirely in the elastic regime when compressed. Specifically, in one embodiment, the elastic portion behaves elasticity over substantially the entire electrical path length of the contact element. In the present description, the "electrical path length" of the contact element is defined as the distance the electrical current has to travel from the pad of the electronic component to the connector and is illustrated as the distance A—A' in FIG. 2A. In connector 50 of the present invention, elastic portion 55B remains elastic over the entire electrical path length and does not become plastically deformed under typical load condition or typical insertion force that is applied to the connector when used in an integrated circuit assembly.

More importantly, the elastic working range of the elastic portion is maintained even when the dimension of the contact element is scaled down. This represent a significant improvement over conventional interconnect technologies which can become plastically deformed at a lower contact force when the contacts are scaled down. Thus, for small geometry interconnects, the conventional interconnect technologies cannot provide reliable separable connections because the connectors typically become permanently deformed upon initial insertion. However, the connector of the present invention can provide reliable remountable connection even over repeated insertions.

Figure 3:
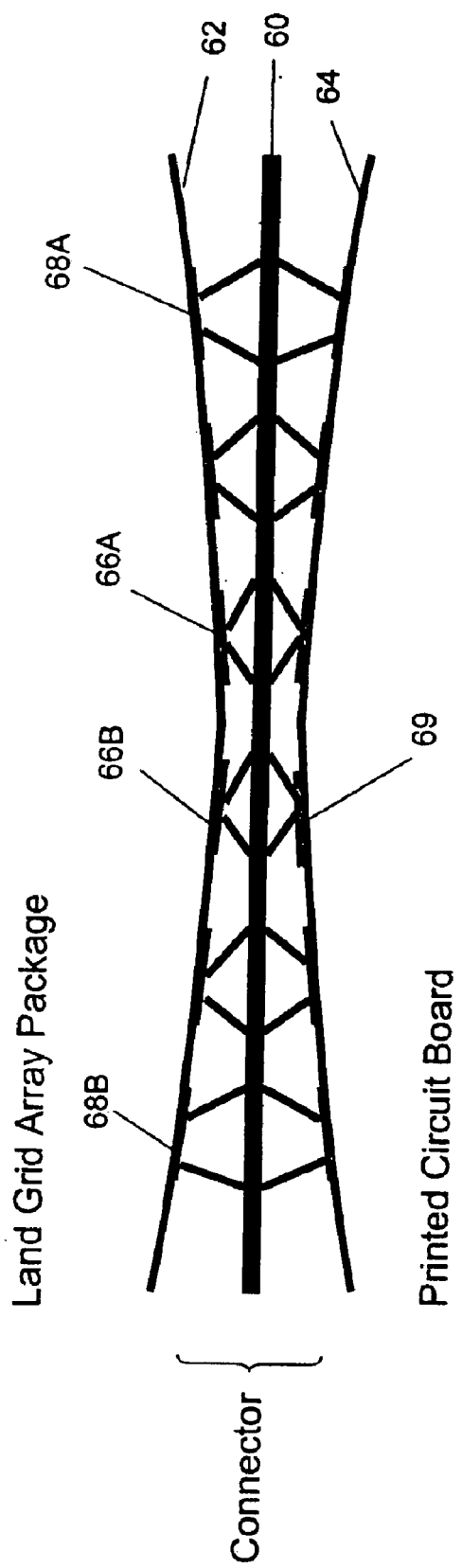
FIG. 3 is a cross-sectional diagram illustrating the use of a connector for interconnecting a land grid array package and a PC board in accordance with the present invention.

The large elastic working range of the connector of the present invention enables the connector to accommodate normal coplanarity variations and positional misalignments in the electronic components to be connected. The connector is thus capable of providing reliable electrical connection despite coplanarity and positional irregularities that may exist in conventional electronic components. FIG. 3 is a cross-sectional diagram illustrating the use of a connector 60 for interconnecting a land grid array package 62 and a PC board 64. In the present illustration, connector 60 includes a first set of contact elements formed on the top surface of the connector and a second set of contact elements formed on the bottom surface of the connector.

As discussed above, coplanarity variations can occur both in a LGA package 62 and in PC board 64 to which the package is to be connected. In operation, connector 60 of the present invention provides reliable electrical connection between LGA package 62 and PC board 64, despite the presence of coplanarity variations. Specifically, due to the large elastic working range of the contact elements, some contact elements (such as 66A and 66B) can become more compressed so that other contact elements (such as 68A and 68B) can make effective electrical connections to pads that are vertically offset due to warping of the package body. Furthermore, the large elastic working range of the contact elements also permit the contact elements to make contact to pads that are positionally misaligned (such as pad 69 on PC board 64). In this manner, each pad on LGA package 62 is connected to each pad of PC board 64 through a pair of contact elements in connector 60. Either LGA package 62 or PC board 64 can be demounted and remounted without degrading the integrity of connector 60.

Figure 4A:
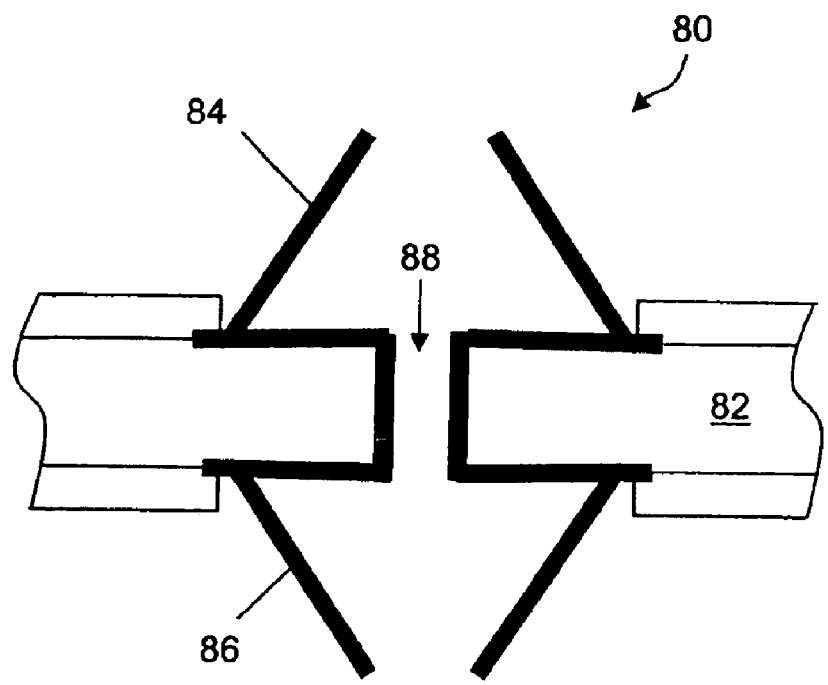
FIG. 4A is a cross-sectional view of a connector according to one embodiment of the present invention.
Figure 4B:
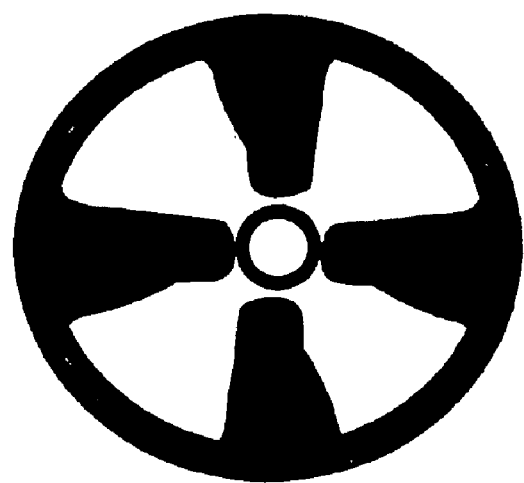
FIG. 4B is a top view of a contact element in the connector of FIG. 4A.

Returning to FIG. 2A, contact element 54 is formed on a contiguous substrate 52. However, this is illustrative only and in other embodiments, substrate 52 may include apertures or holes, such as those for use in through-hole connection of conductive elements on the two surfaces of the substrate. FIG. 4A is a cross-sectional view of a connector according to an alternate embodiment of the present invention. FIG. 4B is a top view of a contact element in the connector of FIG. 4A. In the embodiment shown in FIG. 4A, connector 80 includes two sets of contact elements formed on the top and bottom surfaces of dielectric substrate 82. Thus, connector 80 can be used to connect between two land grid array components with pads as leads. Furthermore, connector 80 includes a central aperture 88 formed in dielectric substrate 82. Conductive traces for connecting contact element 84 on the top surface to contact element 86 on the bottom surface are coupled through central aperture 88. The diameter of central aperture 88 can be varied and can be made as large as the base portion of the contact elements. The exact dimension of central aperture 88 is not critical to the practice of the present invention.

Figure 4C:
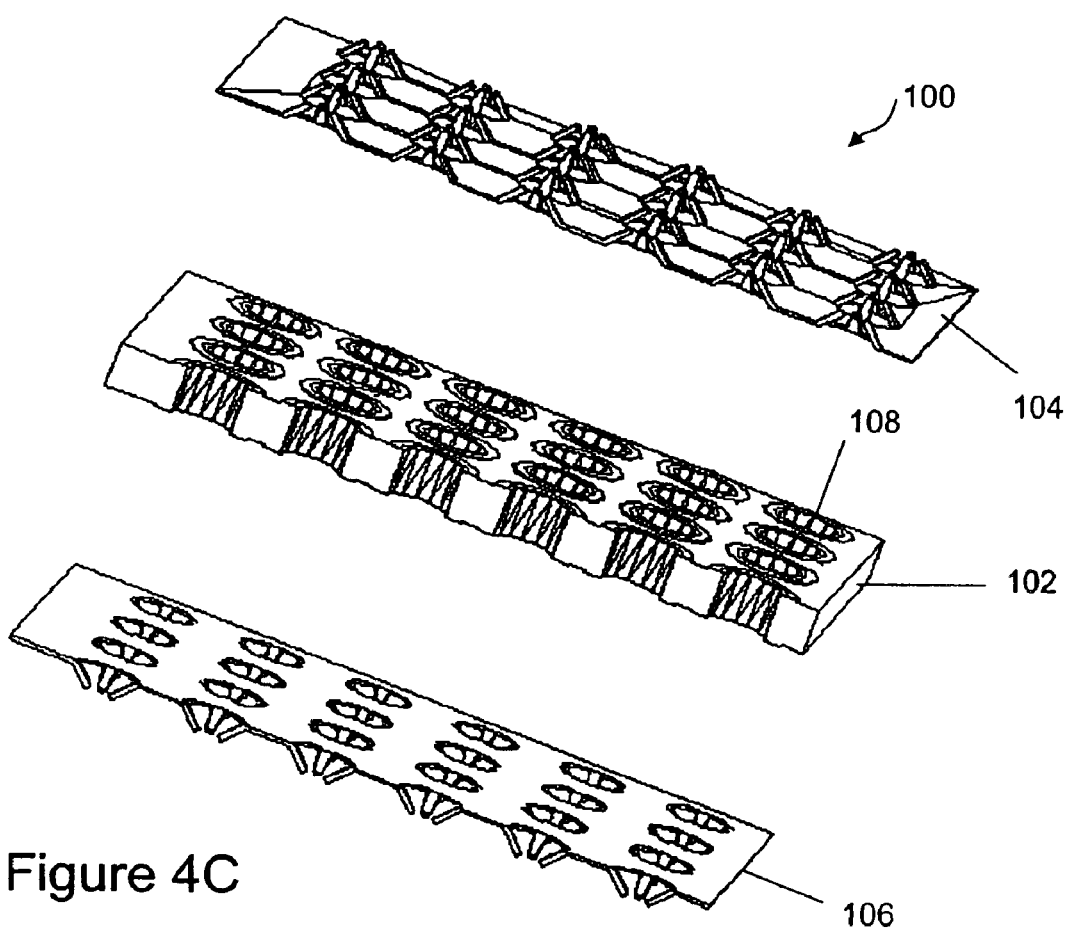
FIG. 4C is a perspective view of a connector according to one embodiment of the present invention.

FIG. 4A illustrates connector 80 as including one contact element 84 connected to one contact element 86. In practice, connector 80 typically includes an array of contact elements arranged in a manner to meet the floor plan of the leads of the electronic modules to be connected. FIG. 4C is a perspective view of a connector 80 according to one embodiment of the present invention. Referring to FIG. 4C, connector 100 includes a first set of contact elements 104 formed on a first major surface of a dielectric substrate 102 and a second set of contact elements 106 formed on a second major surface of dielectric substrate 102. Each pair of contact elements 104 and 106 are aligned with a hole 108 formed in substrate 102. Metal traces are formed through hole 108 to connect a contact element from the first major surface to a contact element from the second major surface.

Note that FIG. 4C illustrates connector 100 during an intermediate step in the manufacturing process for forming the connector. Therefore, the array of contact elements is shown as being connected together on a sheet of metal or metallic material. In the subsequent manufacturing steps, the metal sheet between the contact elements is patterned to remove unwanted portions of the metal sheet so that the contact elements are isolated as needed. For example, the metal sheet can be etched to isolate each contact element.

The process for forming the connector of the present invention will be described in more detail below.

In one embodiment, the connector of the present invention is formed as follows. First, a dielectric substrate including conductive paths between the top surface and the bottom surface is provided. The conductive paths can be in the form of vias or an aperture as shown in FIG. 2A and FIG. 4A. In one embodiment, the dielectric substrate is a piece of FR-4 material with plated through holes. A conductive metal sheet or a multi-layer metal sheet is then patterned to form an array of contact elements including the base portion and the elastic portion(s). The contact elements can be formed by etching or stamping or other means. The protrusion or bending of the elastic portions of the contact elements can be formed by stamping. The metal sheet is attached to the first major surface of the dielectric substrate. When a second set of contact elements is to be included, a second conductive metal sheet or multi-layer metal sheet is accordingly patterned and attached to the second major surface of dielectric substrate 102. The metal sheet(s) can then be patterned to remove unwanted metal from the sheet(s). For example, the metal sheet(s) may be etched so that the contact elements are isolated from each other as needed. The metal sheet(s) can be patterned by etching or scribing or stamping or other means.

One of ordinary skill in the art, upon being apprised of the present invention, would appreciate that the connector of the present invention can be manufactured in a variety of processes and in a variety of process sequences. The above-described process is illustrative only and is not intended to be limiting. For instance, in other embodiments, the protrusion of the elastic portions can be formed after the metal sheet including patterned contact elements has been attached to the dielectric substrate. In other alternate embodiments, the unwanted portions of the metal sheet(s) can be removed before the contact elements are formed. Also, the unwanted portions of the metal sheet(s) can be removed before the metal sheet(s) are attached to the dielectric substrate.

Furthermore, in the embodiment shown in FIG. 4C, conductive traces are formed in the plated through holes and also on the surface of the dielectric substrate 102 in a ring-shaped pattern encircling each plated through holes (denoted as feature 103). While such a conductive ring can be provided to enhance the electrical connection between the contact elements on the metal sheet and the conductive traces formed in the dielectric layer, the conductive ring is not a required component of the connector of the present invention. In one embodiment, the connector can be formed by using a dielectric substrate including through holes (not plated). A metal sheet including an array of contact elements can be attached to the dielectric substrate. After the metal sheet is patterned to form individual contact elements, the entire structure can then be plated to form conductive traces in the through holes connecting the contact elements through the holes to the respective terminals on the other side of the dielectric substrate. Numerous modifications to the processing steps and sequence are possible for forming the connector of the present invention.

In accordance with the present invention, the dimension, geometry and material composition of the elastic portion of the contact element can be varied to provide the desired mechanical and electrical properties. Thus, the thickness, width, length, and shape of the elastic portions can be selected to provide the desired elasticity. The number of elastic portions can also be selected to obtain the desired mechanical and electrical properties. The description below provides more details concerning the relationship between the size and geometry of the elastic portions and the electrical and mechanical properties of the same.

Figure 5A:
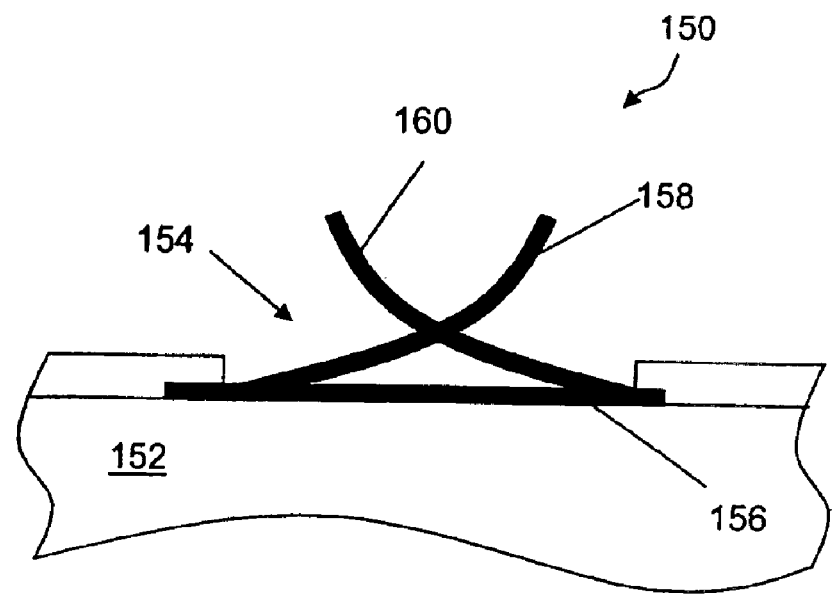
FIG. 5A is a cross-sectional view of a connector according to an alternate embodiment of the present invention.
Figure 5B:
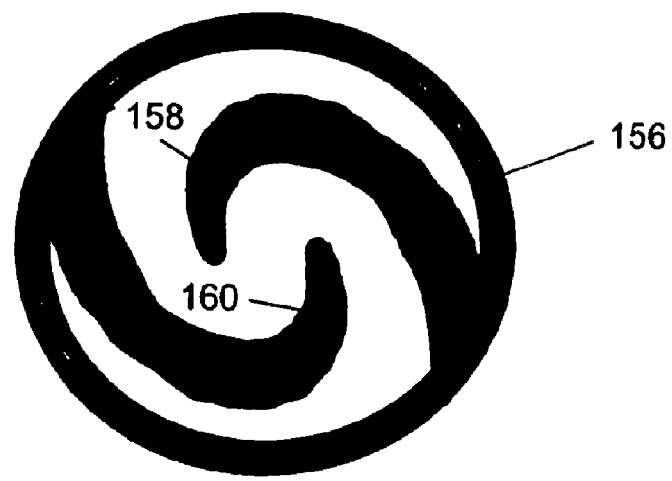
FIG. 5B is a top view of a contact element in the connector of FIG. 5A.

Furthermore, in FIGS. 2A and 4A, the elastic portions of the contact elements are formed as flanges projecting linearly inward from the base portion. That is, the flanges are shaped in a straight line. The linear flange shape is illustrative only and the elastic portions of the contact elements of the present invention can assume other shapes depending on the desired mechanical and electrical properties. FIGS. 5A and 5B illustrate a contact element according to an alternate embodiment of the present invention. Referring to FIG. 5A, a connector 150 in accordance with the present invention includes a contact element 154 formed on a dielectric substrate 152. Contact element 154 includes a base portion 156 and two elastic portions 158 and 160 extending from the base portion. In the present embodiment, elastic portions 158 and 160 are formed in a spiral shape whereby the two elastic portions extend upward from the top surface of substrate 152 in spiral fashion. The spiral shaped elastic portions provide additional benefits over a linearly shaped elastic portions. Specifically, the length of the elastic portions engaging a land area is effectively extended and the elastic working range of the elastic portion is accordingly lengthened. One of ordinary skill in the art, upon being apprised of the present invention, would appreciate that the elastic portions can be formed in a variety of shapes to obtain the desired mechanical and electrical properties.

According to another aspect of the present invention, a connector for land grid array (an LGA connector) is provided with contact elements with different operating properties. That is, the LGA connector includes heterogeneous contact elements where the operating properties of the contact elements can be selected to meet requirements in the desired application. In the present description, the operating properties of a contact element refer to the electrical, mechanical and reliability properties of the contact element. By incorporating contact elements with different electrical and/or mechanical properties, the LGA connector of the present invention can be made to meet all of the stringent electrical, mechanical and reliability requirements for high-speed interconnect applications.

In accordance with one embodiment of the present invention, individual contact elements of the LGA connector can be formed using any conventional LGA interconnect technology. Typically, a contact element includes a conductive portion for engaging the pad of the land grid array. Individual contact elements can be formed on the top surface of the dielectric substrate, such as by placing the contact elements directly on the top surface, or by embedding a portion of the contact element within the top surface, or by forming a portion of the contact element within an aperture on the top surface of the dielectric substrate. For example, contact elements in the form of metal springs, bundled wires, metal in polymer, solid metal tabs, or any other electrical contact technology can be used to form the individual contact elements. Furthermore, the LGA connector can be formed using the contact element of the present invention and described above. In one embodiment, an LGA connector including heterogeneous contact elements is formed by incorporating different types of contact elements, each contact element selected to provide the desired operating properties. Thus, the LGA connector may include one or a group of contact elements formed using metal springs, one or a group of contact elements formed using bundle wires, and one or a group of contact elements formed using the contact element of FIG. 2A or 4A. In another embodiment, an LGA connector including heterogeneous contact elements is formed by using one type of contact elements (such as the contact element of FIG. 2A or 4A) and specifically engineering one or a group of contact elements to provide a desired operating property different than the operating property of the remaining contact elements.

In one embodiment, an LGA connector includes a first set of contact elements requiring a low contact force and a second set of contact elements requiring a large contact force to engage. In general, a larger contact force correlates to a more robust and lower resistance electrical contact. Thus, in one embodiment of the present invention, contact elements to be connected to the power and ground pins of an integrated circuit are formed as contact elements requiring a large contact force while contact elements to be connected to the signal pins of the integrated circuit are formed as contact element requiring a low contact force. In this manner, the power and ground pins carrying high current can have a low resistance electrical path to minimizing Joule heating while the signal pins can have low contact force to minimize the overall contact force required for the connector.

According to alternate embodiments of the present invention, the following mechanical properties can be specifically engineered for a contact element or a set of contact elements to achieve certain desired operational characteristics. First, the contact force for each contact element can be selected to ensure either a low resistance connection for some contact elements or a low overall contact force for the connector. Second, the elastic working range of each contact element over which the contact element operates as required electrically can be varied between contact elements. Third, the vertical height of each contact element can be varied, such as for accommodating coplanarity variations. Fourth, the pitch or horizontal dimensions of the contact element can be varied.

According to alternate embodiments of the present invention, the electrical properties can be specifically engineered for a contact element or a set of contact elements to achieve certain desired operational characteristics. For instance, the DC resistance, the impedance, the inductance and the current carrying capacity of each contact element can be varied between contact elements. Thus, a group of contact elements can be engineered to have lower resistance or a group of contact elements can be engineered to have low inductance.

In most applications, the contact elements can be engineered to obtain the desired reliability properties for a contact element or a set of contact elements to achieve certain desired operational characteristics. For instance, the contact elements can be engineered to display no or minimal performance degradation after environmental stresses such as thermal cycling, thermal shock and vibration, corrosion testing, and humidity testing. The contact elements can also be engineering to meet other reliability requirements defined by industry standards, such as those defined by the Electronics Industry Alliance (EIA).

When the contact elements in accordance with the present invention is used to form the LGA connector, the mechanical and electrical properties of the contact elements can be modified by changing the following design parameters. First, the thickness of the elastic portion, such as the flanges, can be selected to give a desired contact force. For example, a flange thickness of about 40 microns typically gives low contact force on the order of 20 grams or less while a flange thickness of 80 microns gives a much higher contact force of over 100 grams for the same displacement. The width, length and shape of the elastic portion can also be selected to give the desired contact force.

Second, the number of elastic portions to include in a contact member can be selected to achieve the desired contact force, the desired current carrying capacity and the desired contact resistance. For example, doubling the number of flanges roughly doubles the contact force and current carrying capacity while roughly decreasing the contact resistance by a factor of two.

Third, specific metal composition and treatment can be selected to obtain the desired elastic and conductivity characteristics. For example, Cu-alloys, such as copper-beryllium, can be used to provide a good tradeoff between mechanical elasticity and electrical conductivity. Alternately, metal multi-layers can be used to provide both excellent mechanical and electrical properties. In one embodiment, a stainless steel flange is coated with copper (Cu) and then nickel (Ni) and finally gold (Au) to form a stainless steel/Cu/Ni/Au multilayer. The stainless steel will provide excellent elasticity and high mechanical durability while the Cu provides excellent conductivity and the Ni and Au layers provide excellent corrosion resistance. Finally, cold working, alloying, annealing, and other metallurgical techniques can be used to engineer the specific desired properties of the elastic portion.

Figure 6:
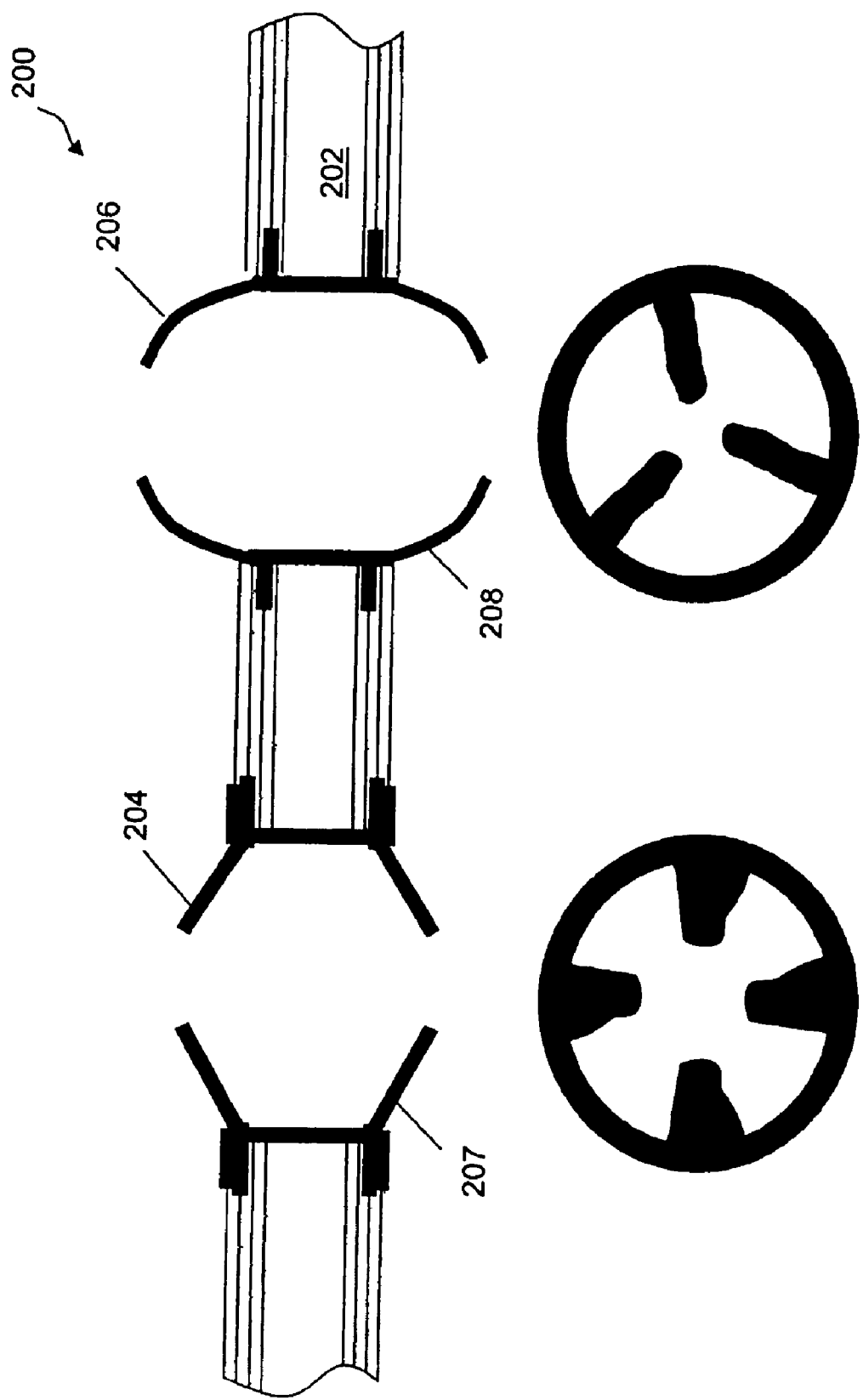
FIG. 6 is a cross-sectional view of a connector according to one embodiment of the present invention.

Fourth, the bend shape of the elastic portion can be designed to give certain electrical and mechanical properties. The height of the elastic portion, or the amount of protrusion from the base portion, can also be varied to give the desired electrical and mechanical properties. FIG. 6 is a cross-sectional view of a connector according to one embodiment of the present invention. Referring to FIG. 6, connector 200 includes a first contact element 204 and a second contact element 206 formed on the top surface of a dielectric substrate 202. A matching pair of contact elements 207 and 208 is also formed on the bottom surface of dielectric substrate 202 to be connected to contact elements 204 and 206, respectively. As discussed above, contact elements 207 and 208 are optional and the bottom terminals of connector 200 may include other types of connection, such as a solder ball or a pin.

In the embodiment shown in FIG. 6, contact element 204 includes four elastic portions formed as flanges projecting straight or linearly from the base portion. On the other hand, contact element 206 includes three elastic portions formed as flanges extending from the base portion in a concave curvature. The width of the flanges in contact element 204 is larger than the width of the flanges in contact element 206. On the other hand, the height of the elastic portions of contact element 206 is greater than the height of the elastic portions of contact element 204. As of result of the present configuration, contact element 204 requires a larger contact force than contact element 206. However, contact element 204 has lower contact resistance and higher current carrying capacity.

By providing contact elements with different mechanical and electrical properties, the LGA connector of the present invention can be advantageously applied in "hot-swapping" applications. Hot-swapping refers to mounting or demounting an electronic component while the system to which the component is to be connected is electrically active without damaging to the electronic component or the system. In a hot-swapping operation, various power and ground pins and signal pins must be connected and disconnected in sequence and not at the same time in order to avoid damages to the component or the system. By using a connector including contact elements with different properties, taller contact elements can be use to make electrical connection before shorter contact elements. In this manner, a desired sequence of electrical connection can be made to enable hot-swapping operation.

Figure 7A:
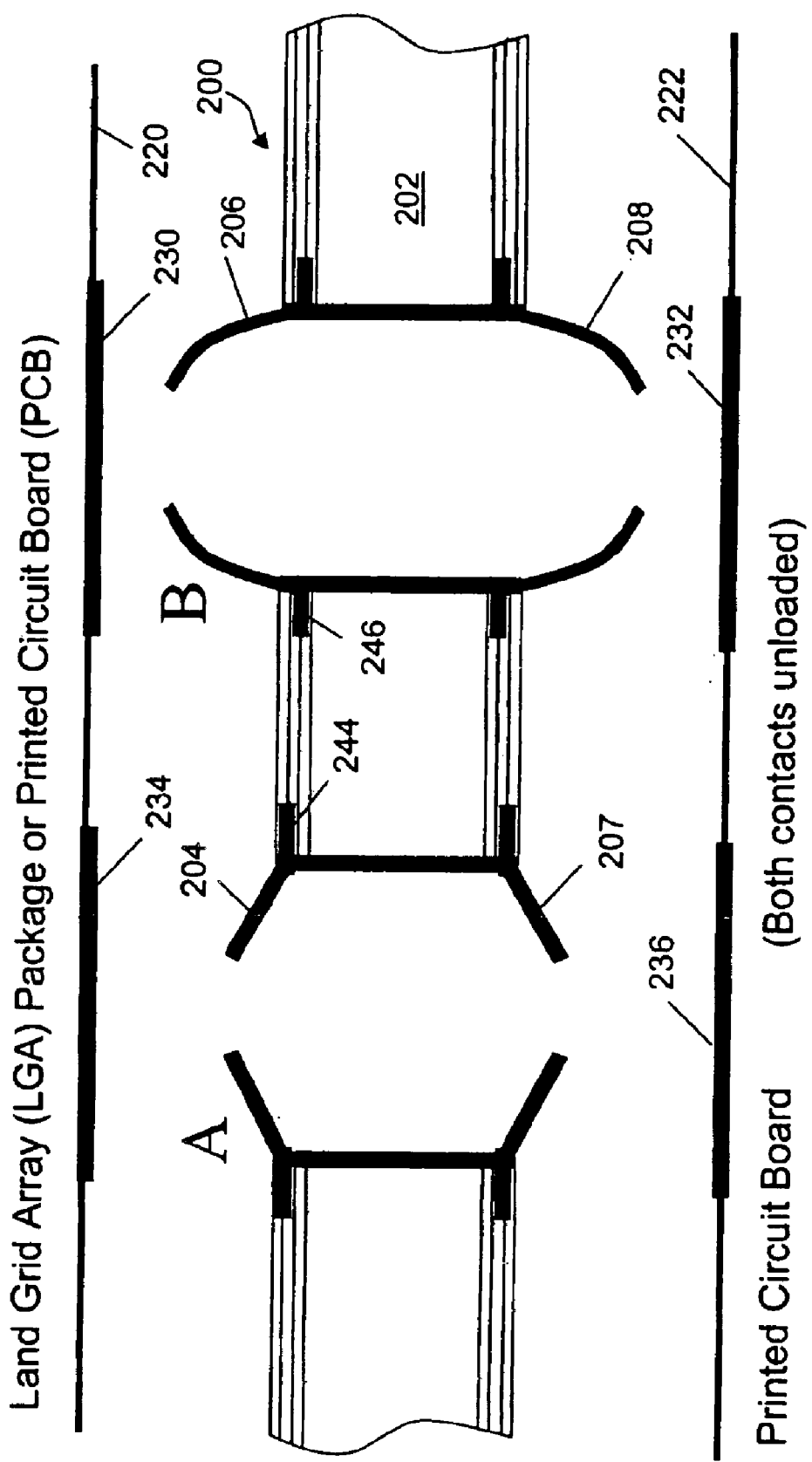
FIGS. 7A to 7C are cross-sectional views of the connector of FIG. 6 being applied in a hot-swapping operation.
Figure 7B:
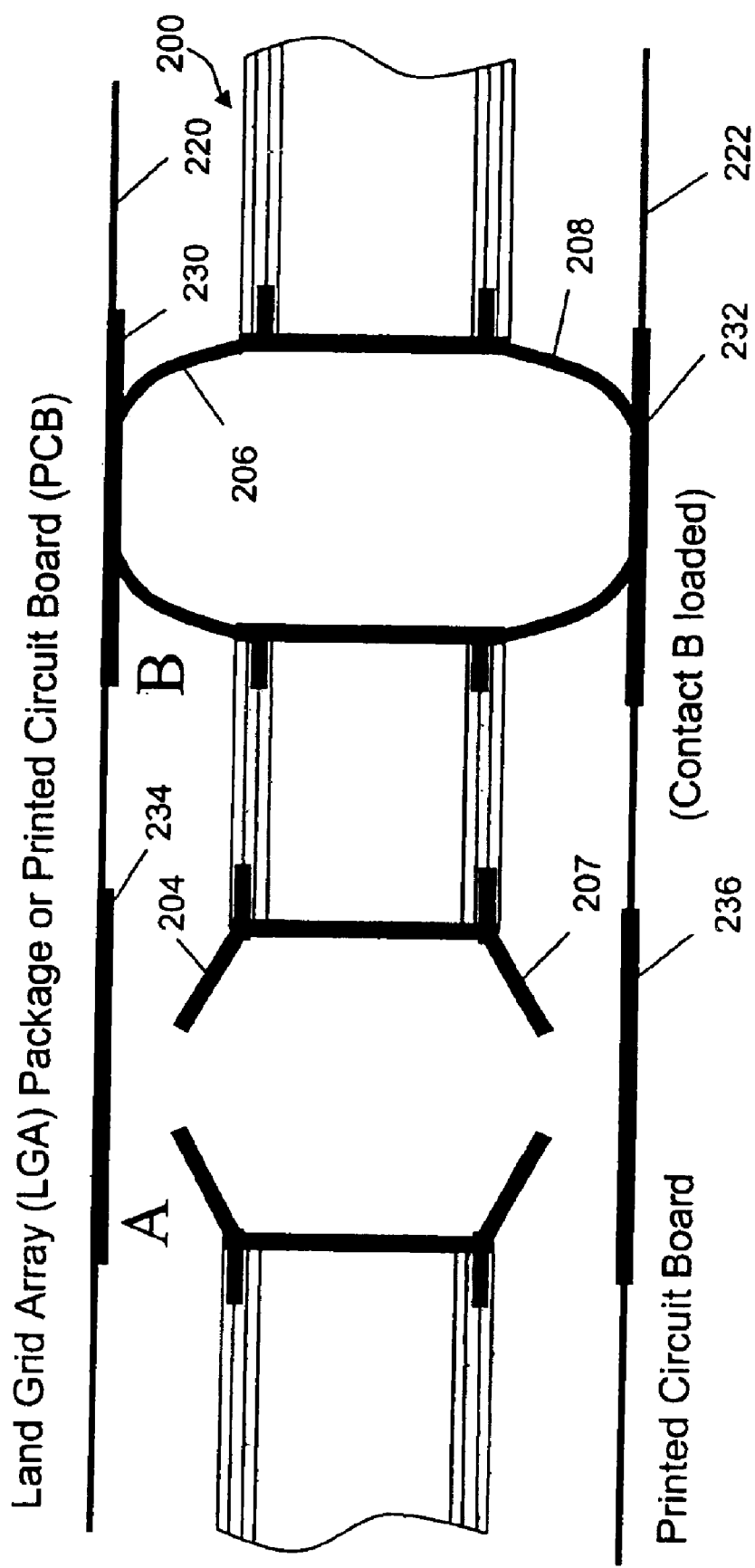
Figure 7C:
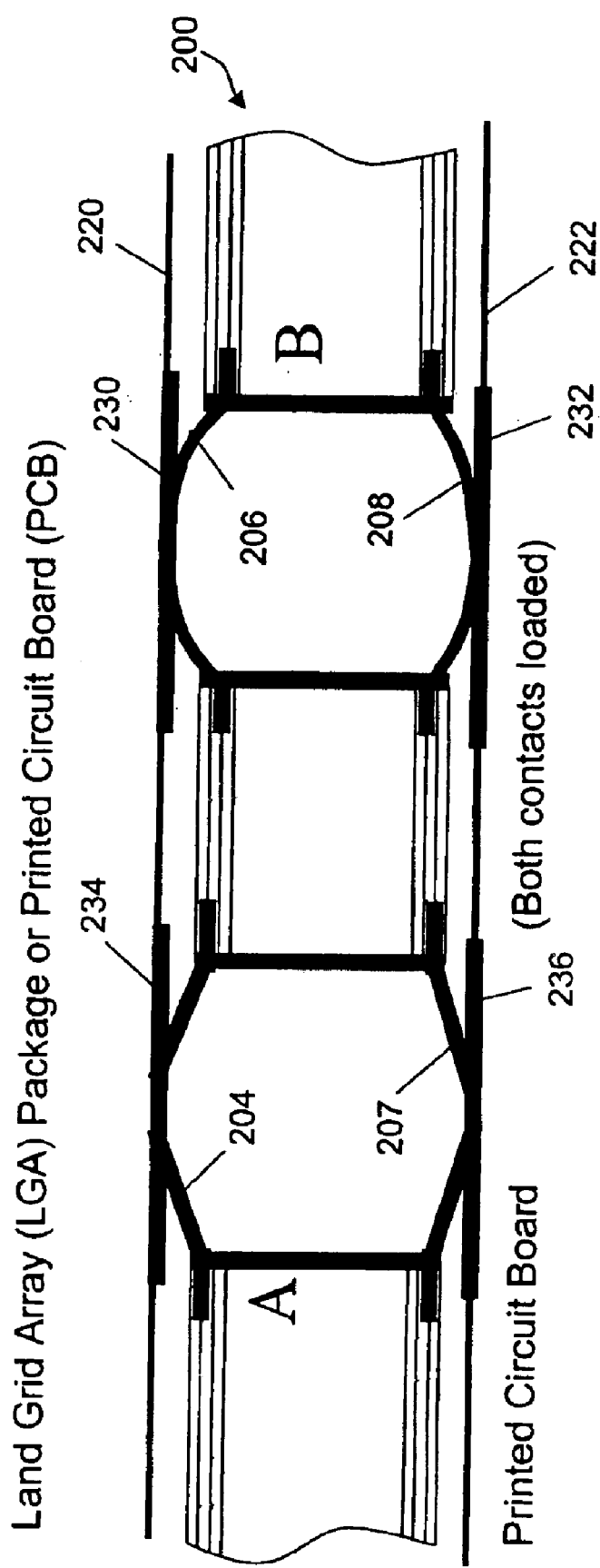

FIGS. 7A to 7C are cross-sectional views of connector 200 of FIG. 6 being applied in a hot-swapping operation. In actual implementation, the height of contact elements 206 and 208 are selected to obtain the desired contact force and desired spacing to achieve reliable hot-swapping operation.

Referring to FIG. 7A, connector 200 is shown in the unloaded condition. Connector 200 is to be connected to a land grid array (LGA) package 220 and a printed circuit board (PC board) 222. A pad 230 on LGA package 220 represents a power connection (that is, either the positive power supply voltage or the ground voltage) of the integrated circuit packaged in the LGA package which is to be connected to a pad 232 on PC board 222. Pad 232 on PC board 222 is electrically active or "powered-up". A pad 234 on LGA package 220 represents a signal pin of the integrated circuit which is to be connected to a pad 236 on PC board 222. To enable hot-swapping operation, power pad 230 should be connected to pad 232 prior to signal pad 234 being connected to pad 236. In accordance with the present invention, connector 200 includes contact elements 206 and 208 having an extended height and a larger elastic working range than contact elements 204 and 207 such that hot-swapping operation between LGA package 220 and PC board 222 is realized using connector 200.

FIG. 7B illustrates an intermediate step during the mounting process of LGA package 220 to PC board 222 using connector 200. When LGA package 220 and PC board 222 are compressed together against connector 200, pad 230 and pad 232 will make electrical contacts to respective contact elements 206 and 208 prior to pads 234 and 236 making connection to contact elements 204 and 207. In the manner, the power connection between LGA package 220 and PC board 222 is established before the signal pads are connected.

FIG. 7C illustrates the mounting of LGA package 220 to PC board 222 in a fully loaded condition. By applying further compression force, LGA package 220 is compressed against connector 200 so that contact element 204 engages signal pad 234. Similarly, PC board 222 is compressed against connector 200 so that contact element 207 engages pad 236 on the PC board. The LGA package is thus mounted onto PC board. In connector 200, as the taller contact elements 206, 208 are compressed more to allow the shorter contact elements 204 and 207 to engage, the contact force required for the connector will increase. In order to minimize the overall contact force required for the connector, the taller contact elements 206, 208 can be designed with a lower spring constant than the shorter contact elements 204 and 207 such that all contact elements are at the optimal contact force in the fully loaded condition.

Figure 7D:
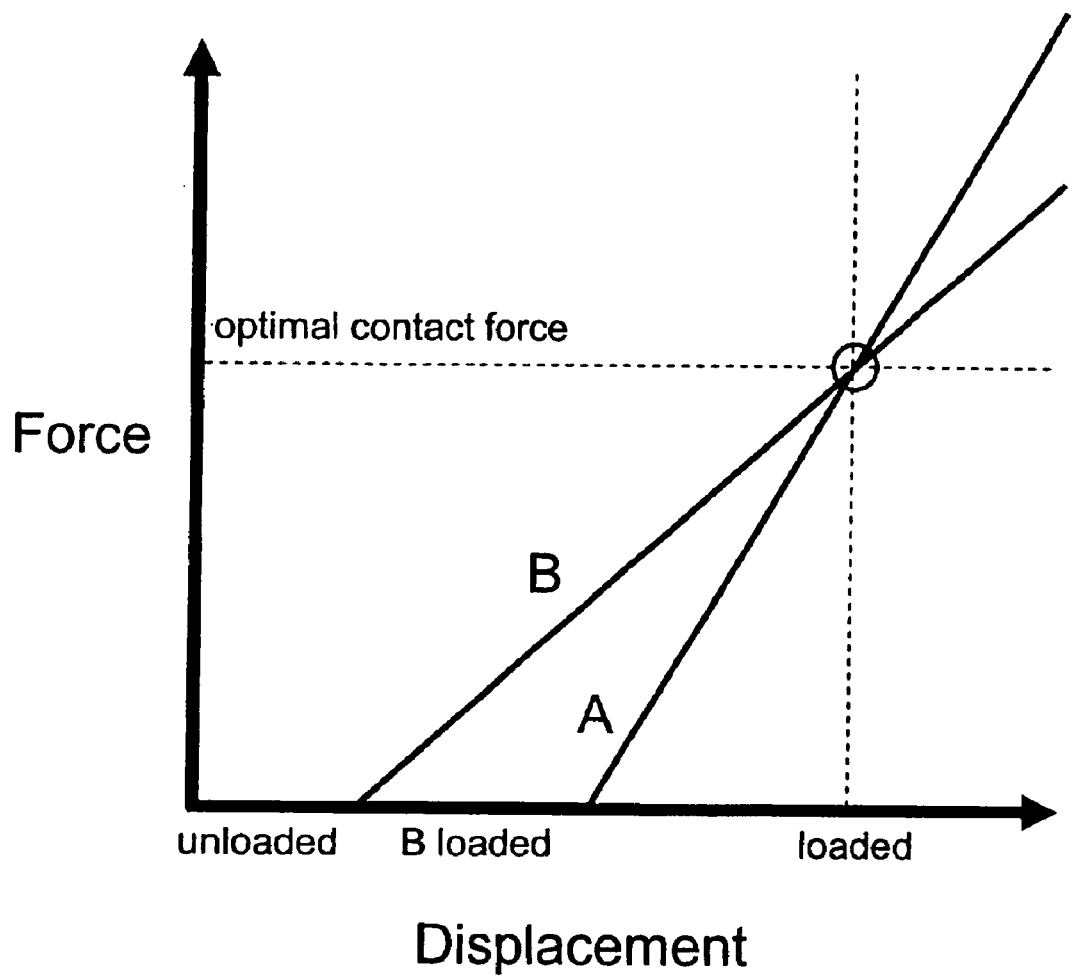
FIG. 7D illustrates the optimization of the contact force using two contact elements with different spring constants.

FIG. 7D illustrates the optimization of the contact force using two contact elements with different spring constants. As shown in FIG. 7B, there is generally an optimal contact force which is the minimum contact force that needs to be applied to provide a stable, reliable electrical connection. By selecting the appropriate spring constant for contact elements 206 and 204, both contact elements can be at their respective optimal contact force when an electronic component is fully loaded onto the connector. For example, as shown in FIG. 7D, contact element 206 can be made to behave according to curve B having a less stiff or more elastic characteristic. Thus, contact element 206 can withstand a larger displacement before reaching its optimal contact force. On the other hand, contact element 204 can be made to behave according to curve A having a more stiff or less elastic characteristic. Thus, contact element 204 withstands a lesser amount of displacement before reaching its optimal contact force. Ultimately, when an electronic component is fully loaded, both contact element 206 and contact element 204 are at the optimal contact force.

FIGS. 6 and 7A to 7C illustrate one embodiment of the connector of the present invention where the contact elements are given different mechanical properties to enable the use of the connector for hot-swapping operation. As discussed above, the connector of the present invention can be designed to include contact elements of other differing mechanical and electrical properties depending on the application in which the connector is used.

Furthermore, in accordance with the present invention, the differing mechanical and electrical properties of the contact elements can be obtained by forming the contact elements using different sheets of metal formed on different layers. Referring again to FIG. 7A, contact elements 204 and 206 are formed using two different metal layers. Specifically, contact element 204 is formed using metal layer 244 while contact element 206 is formed using metal layer 246. Metal layers 244 and 246 are patterned so that only specific contact element or a specific group of contact elements is formed using the respective metal layer. Accordingly, contact element 204 is formed using a different metal alloy than contact element 206. By providing a multi-layer metal structure, the elasticity or current carrying capability of the individual contact element can be tailored to obtain the desired mechanical, electrical and reliability properties.

Figure 7E:
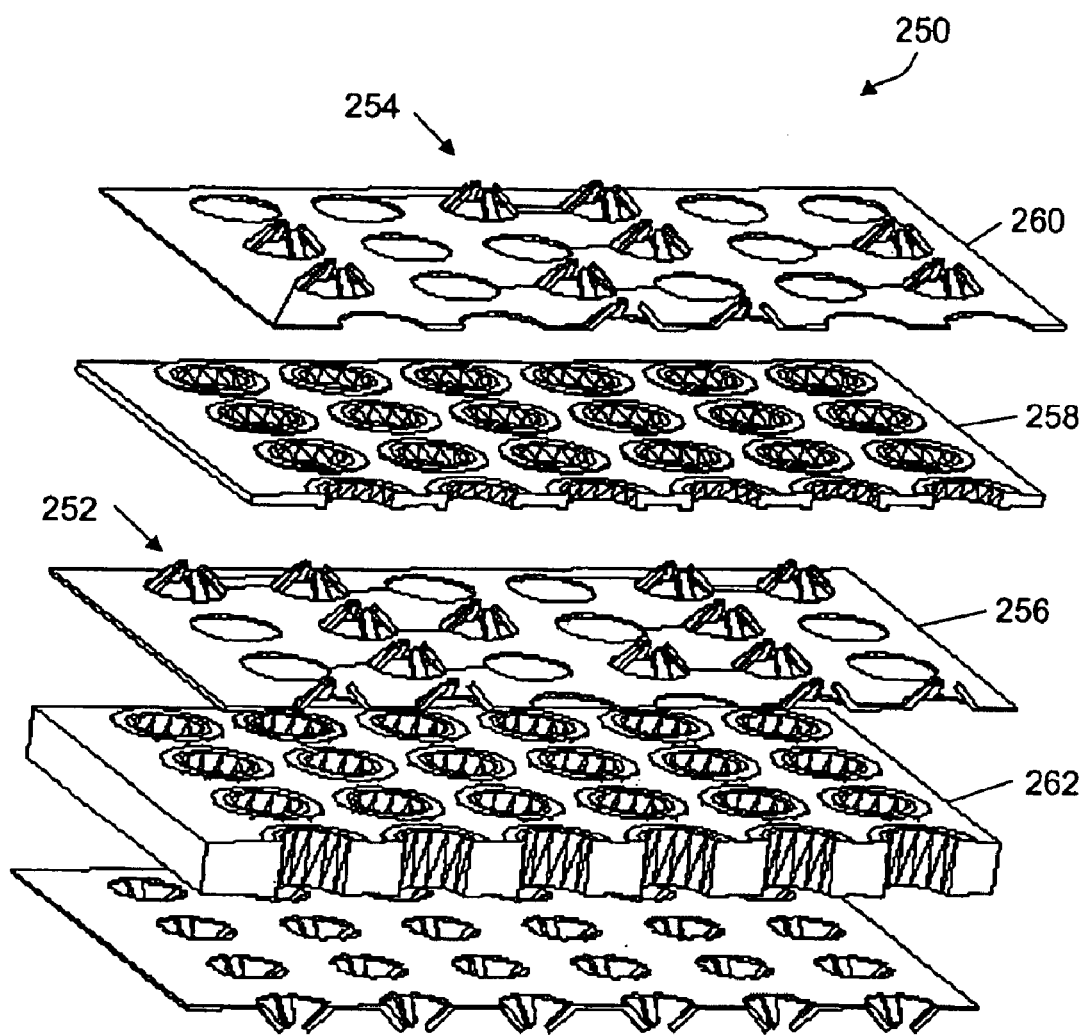
FIG. 7E illustrates a connector including contact elements formed using multiple layers of metals according to another embodiment of the present invention.

FIG. 7E illustrates a connector including contact elements formed using multiple layers of metals according to another embodiment of the present invention. Referring to FIG. 7E, connector 250 includes a multi-layer structure for forming a first group of contact elements 252 and a second group of contact elements 254. In this embodiment, the first group of contact elements 252 is formed using a first metal layer 256 and the second group of contact elements 254 is formed using a second metal layer 260. First metal layer 256 and second metal layer 260 are isolated by a dielectric layer 258. Each metal layer is patterned so that a group of contact elements are formed at desired locations on the specific metal layer. For instance, referring to FIG. 7E, contact elements 252 are formed in metal layer 256 at predefined locations while contact elements 254 are formed in metal layer 260 at locations not occupied by contact elements 252. The different metal layers may include metal layers with different thicknesses or different metallurgies so that the operating properties of the contact elements can be specifically tailored. Thus, by forming a selected contact element or a selected group of contact elements in a different metal layer, the contact elements of connector 250 can be made to exhibit different electrical and mechanical properties.

In one embodiment, contact elements 252 formed using first metal layer 256 constitute ground pin connections whereby the contact elements are connected together using a ground plane formed in substrate 262. On the other hand, contact elements 254 formed by second metal layer 260 constitute individual signal pin connections which are isolated from the ground pin connections in the first metal layer.

In one embodiment, connector 250 can be formed using the following process sequence. First metal layer 256 is stamped to form the first group of contact elements. The stamped metal layer 256 can then be attached to dielectric substrate 262. Subsequently, an insulating layer, such as dielectric layer 258, is formed over first metal layer 256. A second stamped metal layer 260 can be stamped and attached to the dielectric layer 258. Via holes and conductive traces are formed in dielectric substrate 262 and in dielectric layer 258 as needed to provide a conductive path between each contact element to a respective terminal on the opposing side of substrate 262. In this manner, a multi-layer metal structure is formed whereby each metal layer is insulated from the other and different groups of contact elements can be formed using the different metal layers. The different metal layers may include metal layers with different thicknesses or different metallurgies.

As described above, while FIGS. 6 and 7A to 7E illustrate an LGA connector formed using the contact elements of the present invention, an LGA connector including heterogeneous contact elements can be formed using other types of contact elements. The use of the contact elements of the present invention is illustrative only and is not intended to limit the connector of the present invention to include contact elements of the present invention and described above.

According to another aspect of the present invention, a connector is provided with ground planes and the impedance of the contact elements can be controlled by varying the distance between the contact element for a signal pin and the ground plane or between the contact element for a signal pin and the contact element for a ground pin. FIGS. 8A and 8B are cross-section view of connectors including ground planes for improving signal integrity and for controlling contact element impedance. Referring to FIG. 8A, a connector 300 includes a contact element 302 which is to be connected to a signal pin on an electronic component. Connector 300 further includes contact elements 304 and 306 which are to be connected to the ground potential of the electronic component. Connector 300 includes ground planes 310 which are formed on and in dielectric substrate 320. Ground planes 310 can formed on the top surface of substrate 320 or embedded in substrate 320. In the present embodiment, ground planes 310 are connected to contact elements 304 and 306 to be electrically coupled to the ground potential. Of course, in other embodiments, ground planes 310 can be coupled to the ground potential through other means.

The inclusion of ground planes 310 in connector 300 has the effect of improving the signal integrity of the AC electrical signals that are connected through connector 300. Specifically, as integrated circuits are being operated at higher and higher frequencies while the package lead count increases with decreasing lead pitches, the ability to improve signal integrity in a connector used to interconnect such integrated circuits becomes more important. In accordance with the present invention, connector 300 includes ground planes 310 which function to reduce noise and improve signal integrity of the connector. Furthermore, in the configuration shown in FIG. 8A, the distance B to B' between the metal planes associated with contact element 302 for a signal pin and the metal planes associated with contact elements 304 and 306 for the ground potential can be varied to obtain a desired impedance for contact element 302.

FIG. 8B illustrates another embodiment of the connector of the present invention where a pair of contact elements 352 and 354 are used to couple to a pair of differential signals. In the present embodiment, contact elements 352 and 354 are each formed as including conductive planes (such as conductive plane 360). The impedance of contact elements 352 and 354 can be adjusted by varying the distance between the conductive planes associated with the contact elements.

According to yet another aspect of the present invention, an LGA connector is circuitized to incorporate an electrical circuit connecting to one or more contact elements of the connector. In some embodiments, the electrical circuit includes surface mounted or embedded electrical components. By incorporating an electrical circuit coupled to one or more of the contact elements, the LGA connector of the present invention can be provided with improved functionality. A circuitized connector of the present invention can be formed using any conventional LGA interconnect technology. For example, the connector can include contact elements in the form of metal springs, bundled wires, metal in polymer, solid metal tabs, or any other electrical contact technology. Typically, a contact element includes a conductive portion for engaging the pad of the land grid array. Furthermore, the LGA connector can be formed using the contact element of the present invention and described above. Individual contact elements can be formed on the top surface of the dielectric substrate, such as by placing the contact elements directly on the top surface, or by embedding a portion of the contact element within the top surface, or by forming a portion of the contact element within an aperture on the top surface of the dielectric substrate.

Figure 9A:
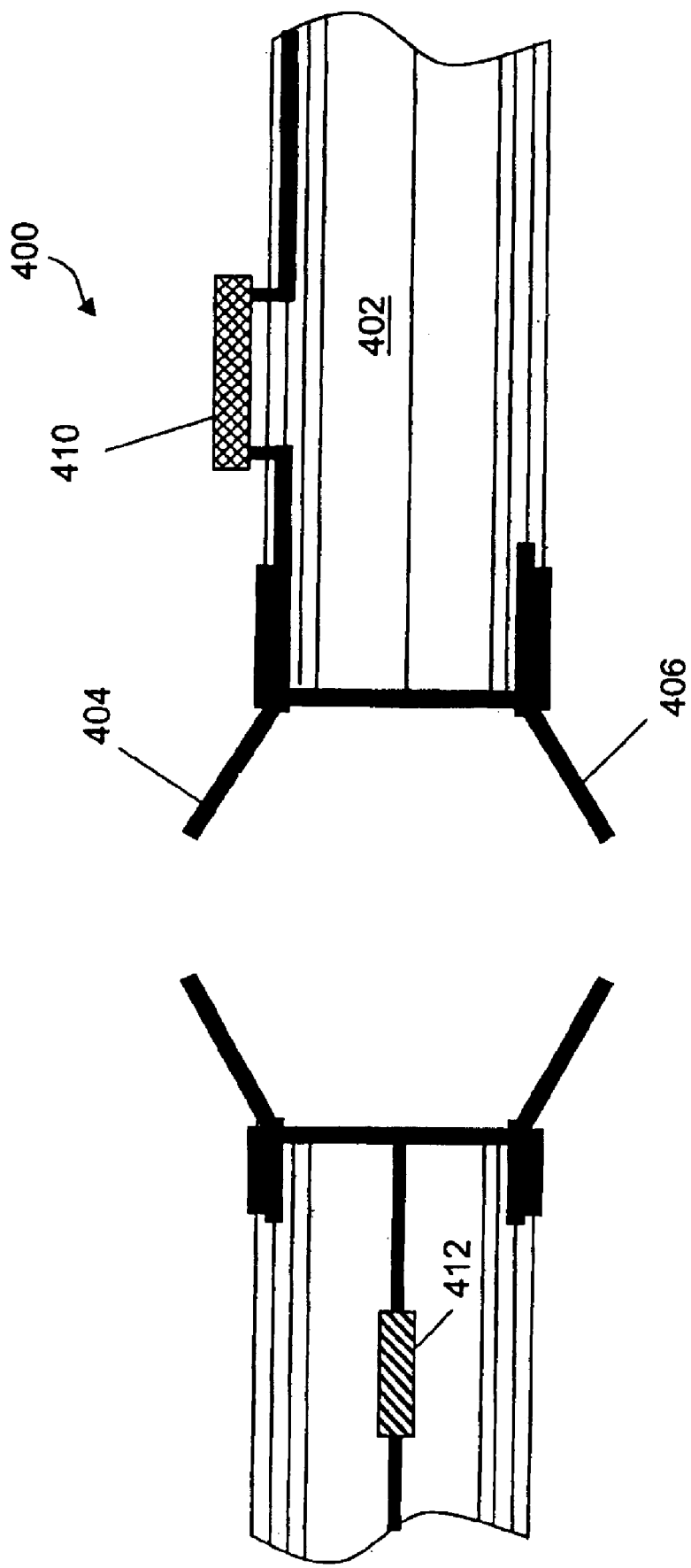
FIG. 9A illustrates one embodiment of a circuitized connector in accordance with the present invention.

FIG. 9A illustrates one embodiment of a circuitized connector in accordance with the present invention. Referring to FIG. 9A, connector 400 includes a contact element 404 on the top surface of dielectric substrate 402 connected to a contact element 406 on the bottom surface of dielectric substrate 402. In the present embodiment, contact element 404 is connected to a surface mounted electrical component 410 and an embedded electrical component 412. Electrical components 410 and 412 may be decoupling capacitors which are positioned on connector 400 so that the capacitors can be placed as close to the electronic component as possible. In conventional integrated circuit assembly, such decoupling capacitors are usually placed on the printed circuit board, distant from the electronic component. Thus, a large distance exists between the electronic component to be compensated and the actual decoupling capacitor, thereby diminishing the effect of the decoupling capacitor. By using circuitized connector 400, the decoupling capacitors can be placed as close to the electronic component as possible to enhance the effectiveness of the decoupling capacitors. Other electrical components that may be used to circuitize the connector of the present invention include a resistor, an inductor and other passive or active electrical components.

Figure 9B:
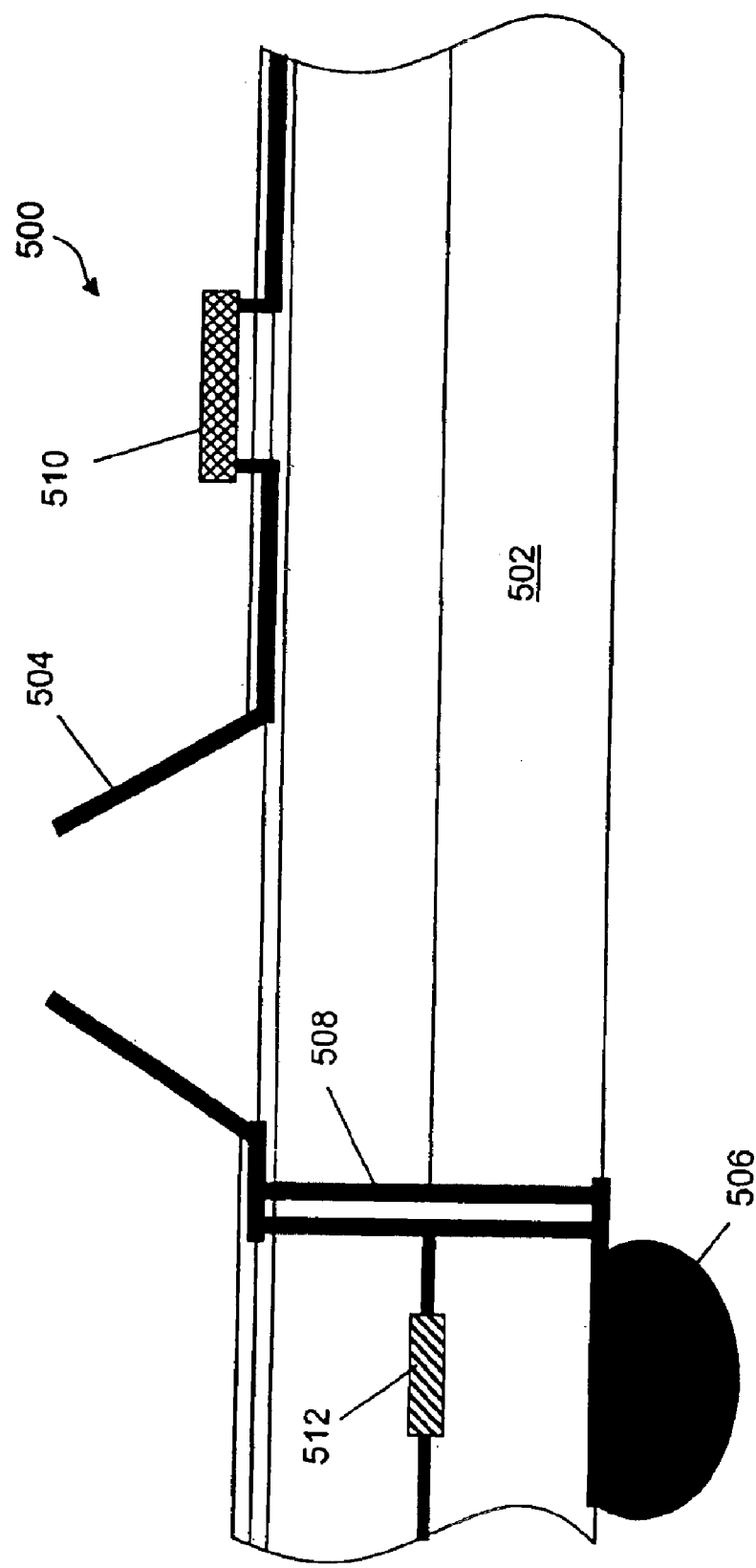
FIG. 9B illustrates another embodiment of a circuitized connector according to the present invention.

FIG. 9B illustrates another embodiment of a circuitized connector according to the present invention. Connector 500 include a contact element 504 on a dielectric substrate 502 coupled to a solder ball terminal 506 through a via 508. Contact element 504 is connected to a surface mounted electrical component 510 and to an embedded electrical component 512. Connector 500 further illustrates that the placement of terminal 506 does not have to be aligned with contact element 504 as long as the contact element is electrically coupled to the terminal, such as through via 508.

Figure 10A:
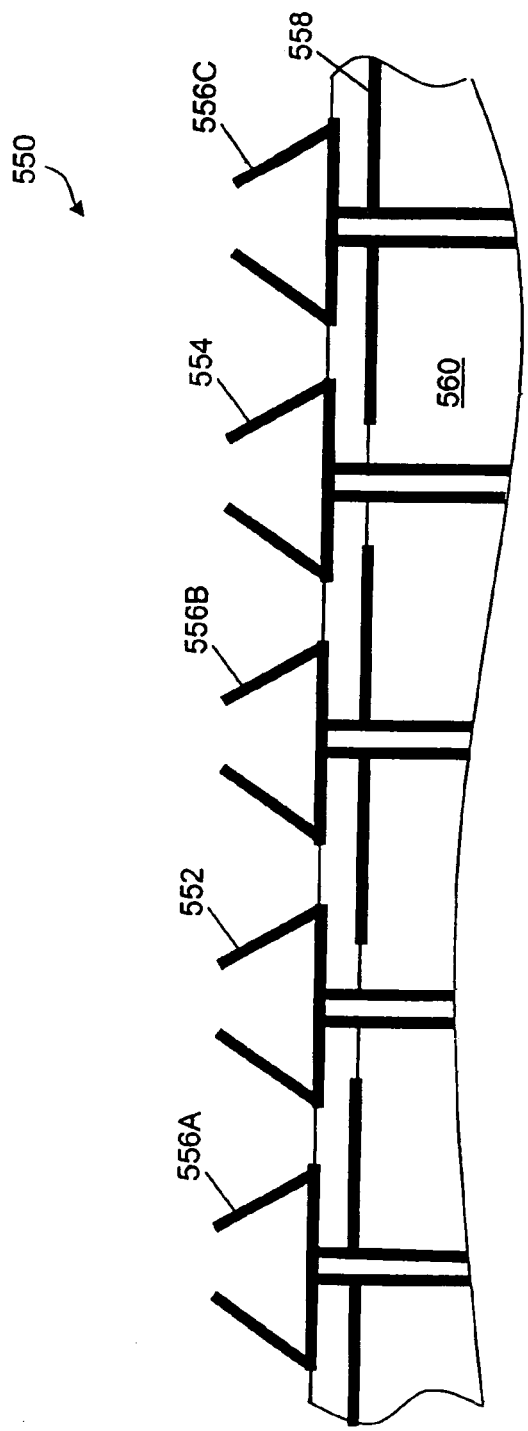
FIG. 10A illustrates another embodiment of a circuitized connector in accordance with the present invention.
Figure 10B:
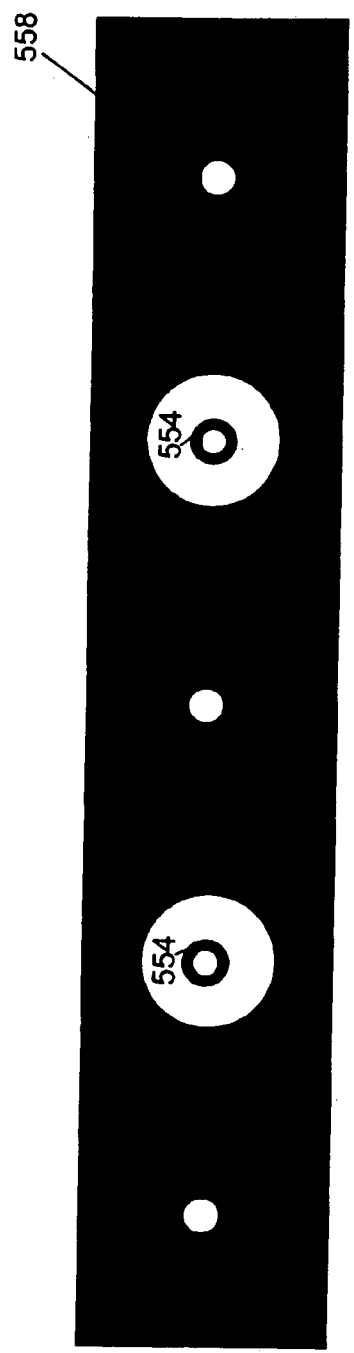
FIG. 10B is a top view of the electrical circuit formed in the dielectric substrate of the connector of FIG. 10A.

Electrical circuits for providing other functionalities can also be applied in the connector of the present invention. In other embodiments, a connector of the present invention is circuitized by linking or connecting the power supply pins of the electronic components together, as illustrated in FIGS. 10A and 10B. Referring to FIG. 10A, a connector 550 includes a contact element 552 and a contact element 554 for carrying signals and contact elements 556A to 556C for coupling to a power supply potential, such as a Vcc or a ground potential. In the present embodiment, connector 550 is circuitized by including a conductive plane 558 electrically connecting contact elements 556A to 556C together. In the present embodiment, conductive plane 558 is forming embedded in substrate 560 and is patterned so that the plane is electrically isolated from contact elements 552 and 554 (FIG. 10B). As demonstrated in FIG. 8, if the conductive plane 558 is a ground plane, the gaps between the conductive plane 558 and the contact elements 552 and 554 can be used to control the contact impedances of contact elements 552 and 554.

In another embodiment, a circuitized connector includes an electrical circuit to redistribute one or more signals from one lead of the electronic component to a number of leads of the other electronic component connected to the connector. FIGS. 10C and 10D illustrate a circuitized connector according to an alternate embodiment of the present invention. Referring to FIGS. 10C and 10D, a circuitized connector 570 includes contact elements 572, 574, 576, 578 and 580. Instead of being connected to a terminal in vertical alignment to each contact element, connector 570 is circuitized so that a contact element formed on the top surface of the substrate may be connected to any one or more terminals formed on the bottom of the substrate. Specifically, the interconnection between the contact elements and the terminals can be realized using metal traces formed in an intermediate layer embedded within the connector substrate. In the present illustration, contact element 572 is connected to a terminal 582 directly below. However, contact element 574 is routed by metal trace 592 to be connected to terminal 588. Similarly, contact element 578 is routed by metal trace 594 to be connected to terminal 584. Finally, contact element 576 is connected to terminal 586 but also connected to contact element 580 and terminal 590 through metal trace 596. Thus, in accordance with the present invention, a connector of the present invention can be circuitized to connect one contact element to a terminal positioned anywhere on the opposite surface of the dielectric substrate. Furthermore, the connector of the present invention can be used to connect a contact element to a plural number of terminals so that any signal applied to the one contact element can be distributed to the plural number of terminals.

As described above, while FIGS. 9A, 9B, 10A and 10C illustrate circuitized connectors formed using the contact elements of the present invention, a circuitized LGA connector can be formed using other types of contact elements. The use of the contact elements of the present invention is illustrative only and is not intended to limit the connector of the present invention to include only contact elements of the present invention and described above.

According to another aspect of the present invention, an LGA connector incorporates embedded thermal dissipation structures to provide enhanced heat dissipation capability at specific contact elements. For instance, when a contact element engaging a lead of an electronic package carries more than 1 A of current, significant Joule heating can result creating a temperature rise of 20 degrees or more at the contact element. In accordance with the present invention, an LGA connector includes embedded thermal dissipation structures so as to effectively limit the temperature rise at specific contact elements. For example, the amount of temperature rise can be reduced to 10 degrees or less by the use of the embedded thermal dissipation structures in the connector of the present invention.

Figure 11:
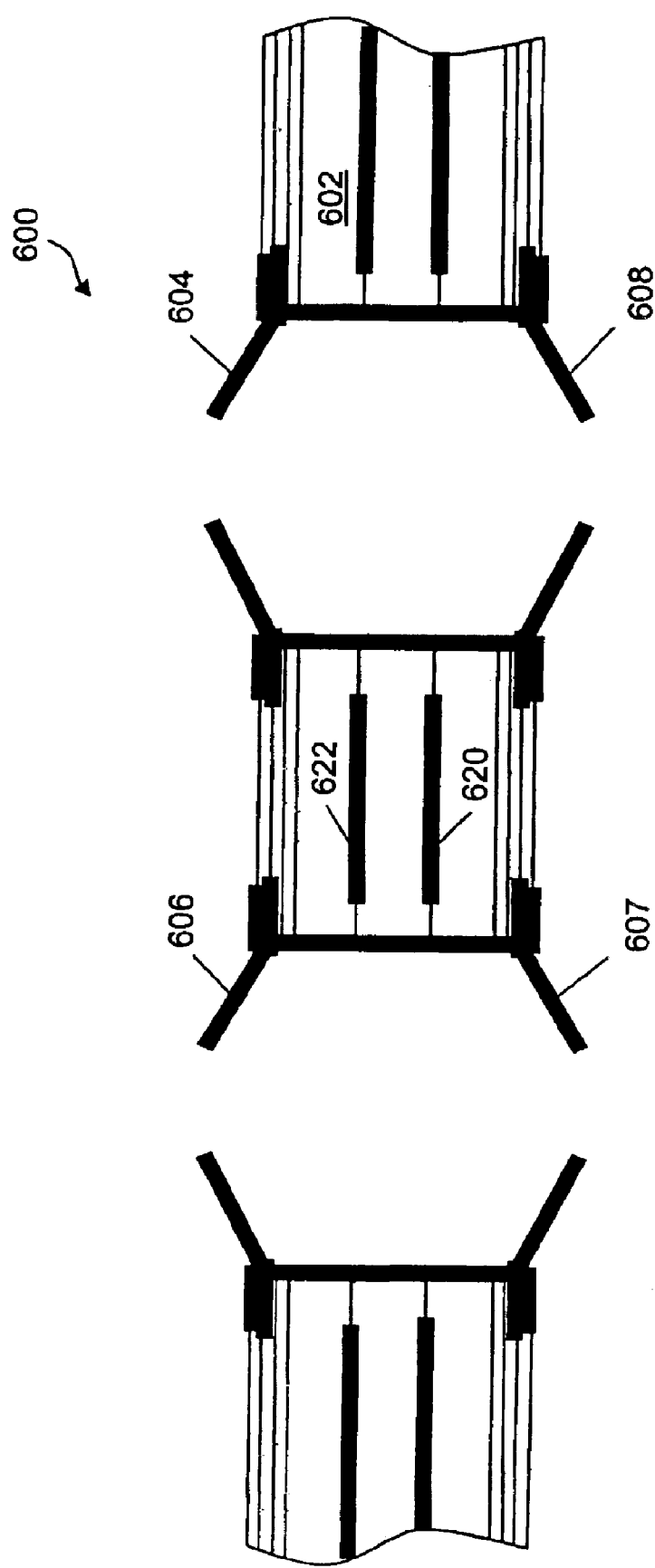
FIG. 11 illustrates a connector incorporating thermally conductive planes according to one embodiment of the present invention.

FIG. 11 illustrates a connector incorporating thermally conductive planes according to one embodiment of the present invention. Referring to FIG. 11, connector 600 includes contact elements 604 and 606 formed on the top surface of dielectric substrate 602. Thermally conductive planes 620 and 622 are formed in substrate 602 during the manufacturing process of substrate 602. Thermally conductive planes 620 and 622 provide heat dissipation function for contact elements 604, 608, 606 and 607. In one embodiment, the thermally conductive planes are formed using Cu. In another embodiment, the thermally conductive planes are formed using filled epoxy, which is not electrically conductive and be in intimate contact with the vias or contact elements without shorting the electrical paths.

Figure 12:
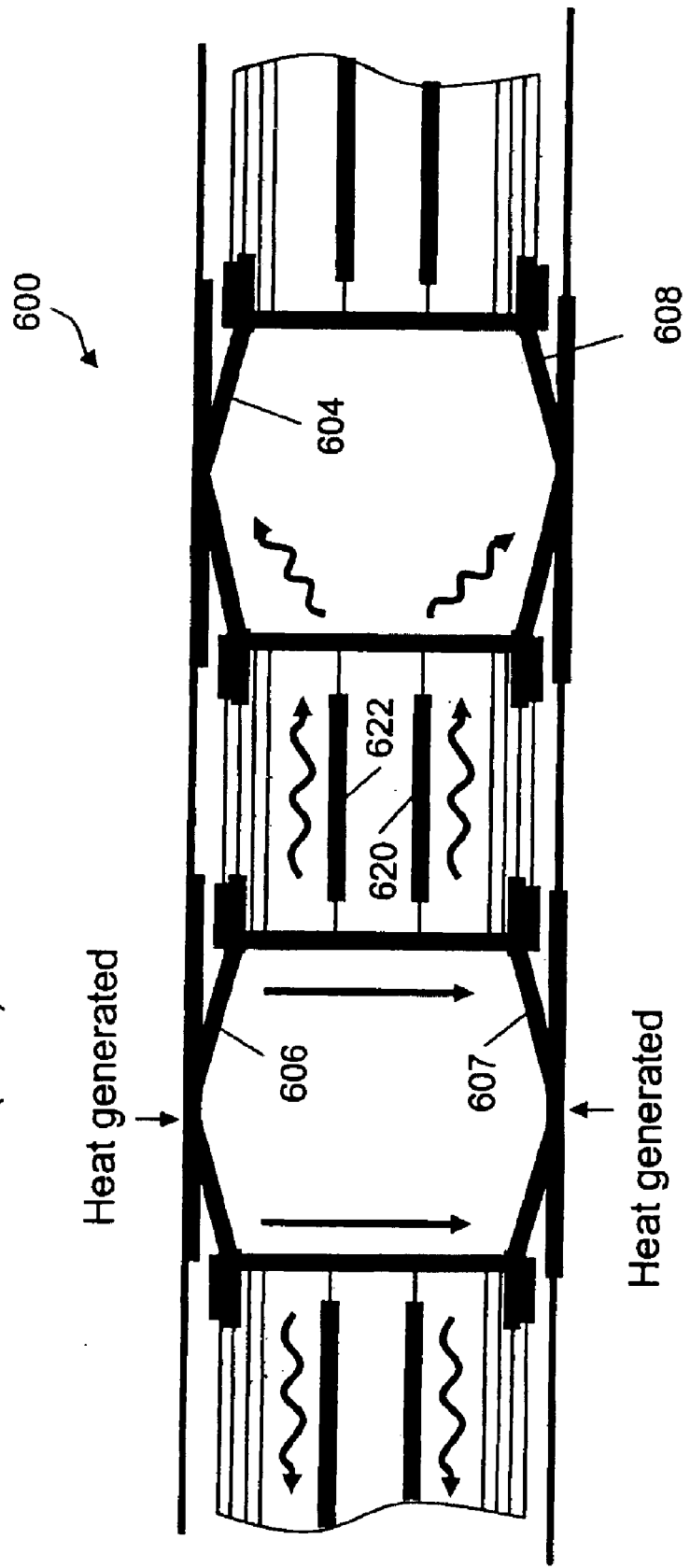
FIG. 12 illustrates the operation of the thermally conductive planes in the connector of FIG. 11.

FIG. 12 illustrates the operation of the thermally conductive planes in connector 600. Referring to FIG. 12, contact elements 606 and 607 are to be connected to pads of the LGA package and the PC board representing a high current connection. Thus, Joule heating at the pads occurs causing heat to be generated at the pads of the LGA package and the PC board. Thermally conductive planes 620 and 622 function to dissipate the heat away from contact elements 606 and 607. In the present illustration, the neighboring contact elements 604 and 608 are connected to a low current carrying signal. Thus, heat generated at contact elements 606 and 607 can be dissipated through thermally conductive planes 620 and 622 and through contact elements 604 and 608.

While the embodiment described above and shown in FIG. 11 utilizes an LGA connector using the contact elements of the present invention, a LGA connector incorporating thermal dissipation structure can be formed using other types of contact elements. For example, the connector can be formed using metal springs and bundle wires. The use of the contact elements of the present invention in the LGA connector of FIG. 11 is illustrative only and is not intended to limit the connector of the present invention to include only contact elements of the present invention and described above.

Figure 13A:
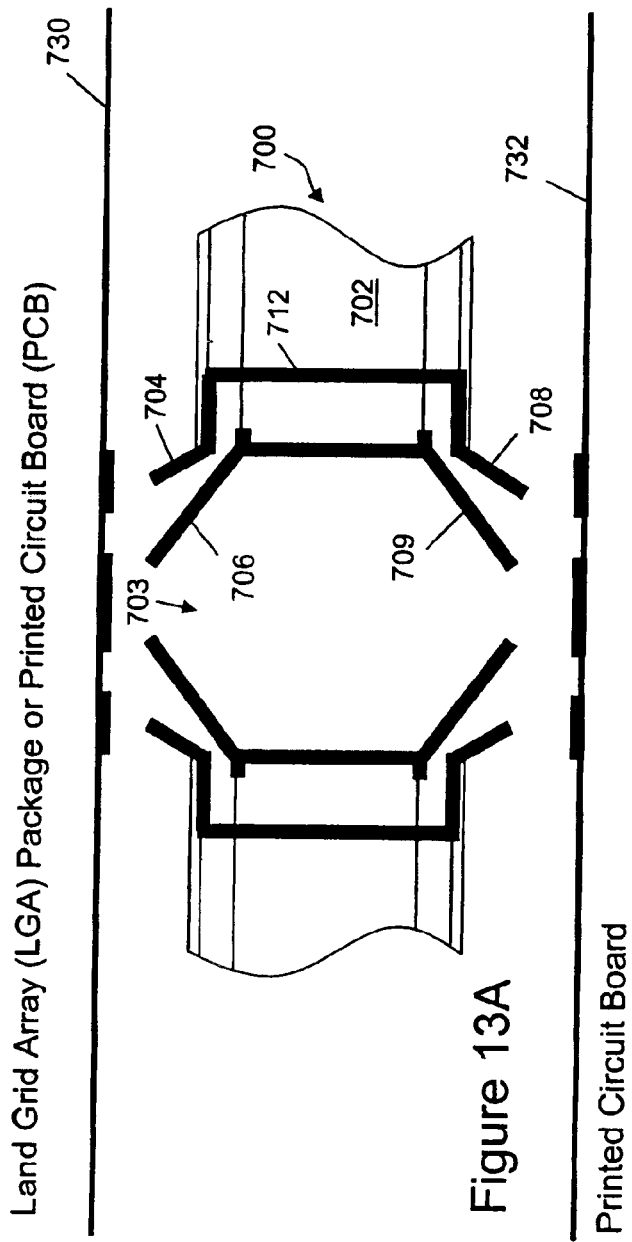
FIG. 13A is a cross-sectional view of a connector including a coaxial contact element according to one embodiment of the present invention.
Figure 13B:
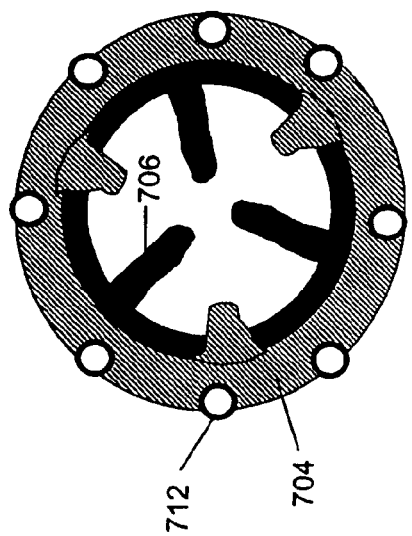
FIG. 13B is a top view of the coaxial contact elements of FIG. 13A.

According to yet another aspect of the present invention, a connector includes one or more coaxial contact elements. FIG. 13A is a cross-sectional view of a connector including a coaxial contact element according to one embodiment of the present invention. FIG. 13B is a top view of the coaxial contact elements of FIG. 13A. Referring to FIG. 13A, connector 700 includes a first contact element 704 and a second contact element 706 formed on the top surface of a dielectric substrate. Contact elements 704 and 706 are formed in proximity to but electrical isolated from each other. In the present embodiment, contact element 704 includes a base portion formed as an outer ring of aperture 703 while contact element 706 includes a base portion formed as an inner ring of aperture 703. Each of contact elements 704 and 706 includes three elastic portions (FIG. 13B). The elastic portions of contact element 704 do not overlap with the elastic portions of contact element 706. In the present embodiment, contact element 704 is connected to a contact element 708 on the bottom surface of dielectric substrate 702 through a via 712. Contact elements 704 and 708 form a first current path, referred herein as the outer current path of connector 700. Furthermore, contact element 706 is connected to a contact element 709 on the bottom surface of dielectric substrate 702 through a metal trace formed in aperture 703. Contact elements 706 and 709 form a second current path, referred herein as the inner current path of connector 700.

Figure 14:
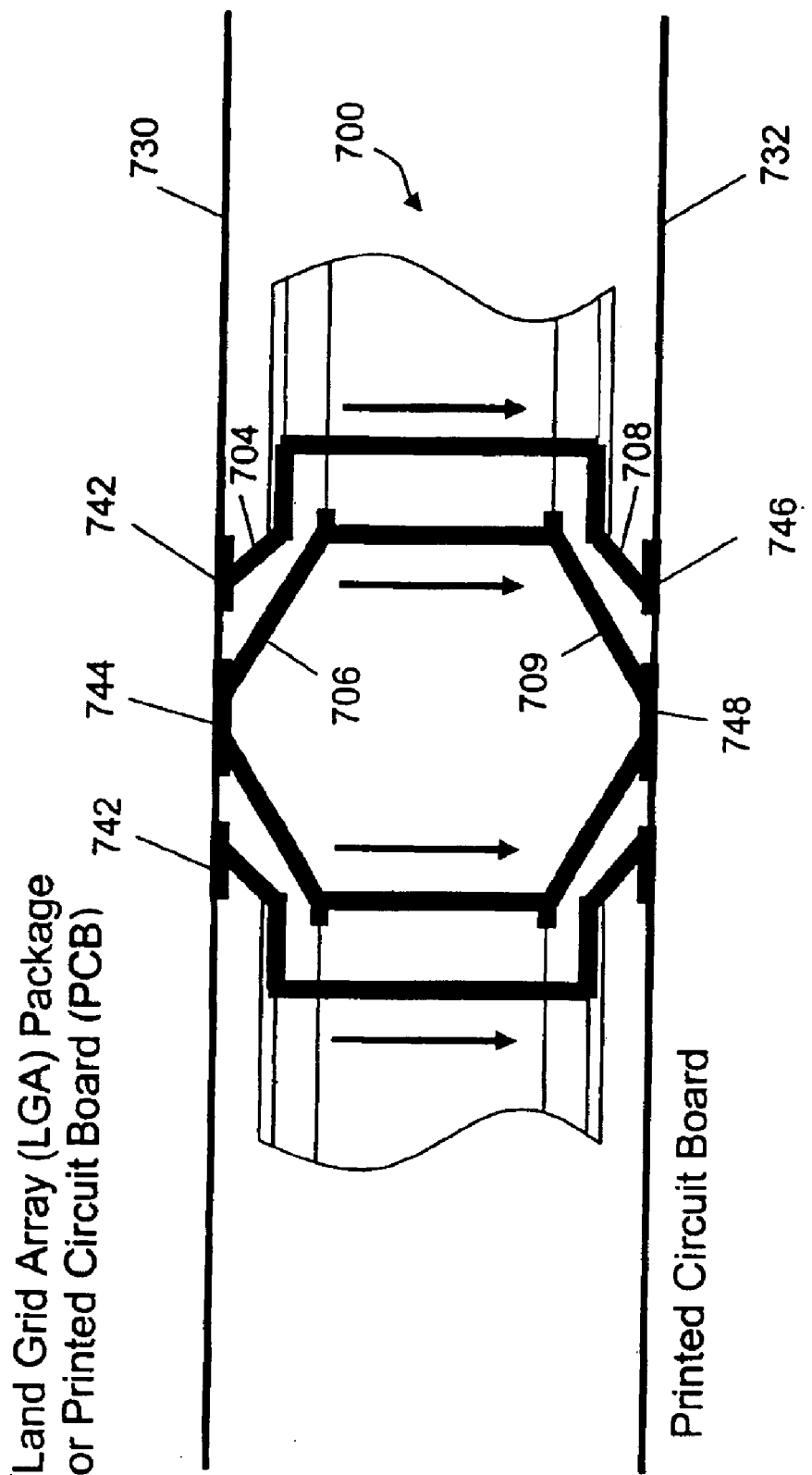
FIG. 14 illustrates the mating of an LGA package to a PC board through the connector of FIG. 13A.

As thus constructed, connector 700 can be used to interconnect a coaxial connection on a LGA package 730 to a coaxial connection on a PC board 732. FIG. 14 illustrates the mating of LGA package 730 to PC board 732 through connector 700. Referring to FIG. 14, when LGA package 730 is mounted to connector 700, contact element 704 engages a pad 742 on LGA package 730. Similarly, when PC board 732 is mounted to connector 700, contact element 708 engages a pad 746 on PC board 732. As a result, the outer current path between pad 742 and pad 746 is formed. Typically, the outer current path constitutes a ground potential connection. On the other hand, contact element 706 engages a pad 744 on LGA package 730 while contact element 709 engages a pad 748 on PC board 732. As a result, the inner current path between pad 744 and pad 748 is formed. Typically, the inner current path constitutes a high frequency signal.

A particular advantage of the connector of the present invention is that the coaxial contact elements can be scaled to dimensions of 1 mm or less. Thus, the connector of the present invention can be used to provide coaxial connection even for small geometry electronic components.

In the above description, the connector of the present invention is illustrated as being used to interconnect an LGA package to a PC board. This is illustrative only and in other embodiments of the present invention, the connector can be used to interconnect two PC boards or two chip modules together. Basically, the connector of the present invention can be generally applied to connect the metal pads (lands) of an area array on an electronic component to the metal pads (lands) of an area array on another electronic component. In the case of the mating of two PC boards, the connector of the present invention provides particular advantages as PC boards are almost never coplanar. Because the connector of the present invention can be applied to accommodate a large coplanarity variation, such as on the order of 200 microns or more, with an insertion force of about 40 grams per contact or less, the connector of the present invention can be readily applied to make area array connections between two PC boards. Furthermore, the connector of the present invention is scalable in both pitch and height to less than 1 mm and is therefore suitable for use in small dimensional area array connections.

Moreover, in the above descriptions, various embodiments of the connector are illustrated as including a first contact element on top and a second contact element on the bottom surface of the substrate. As discussed above, the use of a second contact element on the bottom surface of the substrate to serve as a terminal for the first contact element is illustrative only. The terminal can be formed as other types of electrical connection such as a solder ball or a pin.

According to yet another aspect of the present invention, a printed circuit board (PC board) incorporates an area array of LGA contact elements. Thus, an LGA package, an LGA module or another PC board with an area land grid array formed thereon can be attached to the PC board without the use of an interposer connector. By forming an area array of LGA contact elements, also referred to as a contact grid array, directly on a PC board, a compact and low profile integrated circuit assembly can be realized. Furthermore, the contact grid array provides separable or remountable interconnection for the LGA components to be mounted on the PC board. Thus, the benefit of a separable connection is retained even though a separate intermediate connector is eliminated.

In one embodiment, the contact grid array can be formed using any conventional LGA interconnect technology. Typically, a contact element includes a conductive portion for engaging the pad of a land grid array. For example, the connector can include contact elements in the form of metal springs, bundled wires, metal in polymer, solid metal tabs, or any other electrical contact technology. Individual contact elements can be formed on the top surface of the dielectric substrate, such as by placing the contact elements directly on the top surface, or by embedding a portion of the contact element within the top surface, or by forming a portion of the contact element within an aperture on the top surface of the dielectric substrate. When metal springs and bundled wires are used as contact elements, the contact elements can be secured in their respective locations by compression force from the side walls (compression fit) or by adhesive or by soldering. Furthermore, the contact grid array can be formed using the contact element of the present invention as described above.

Figure 15:
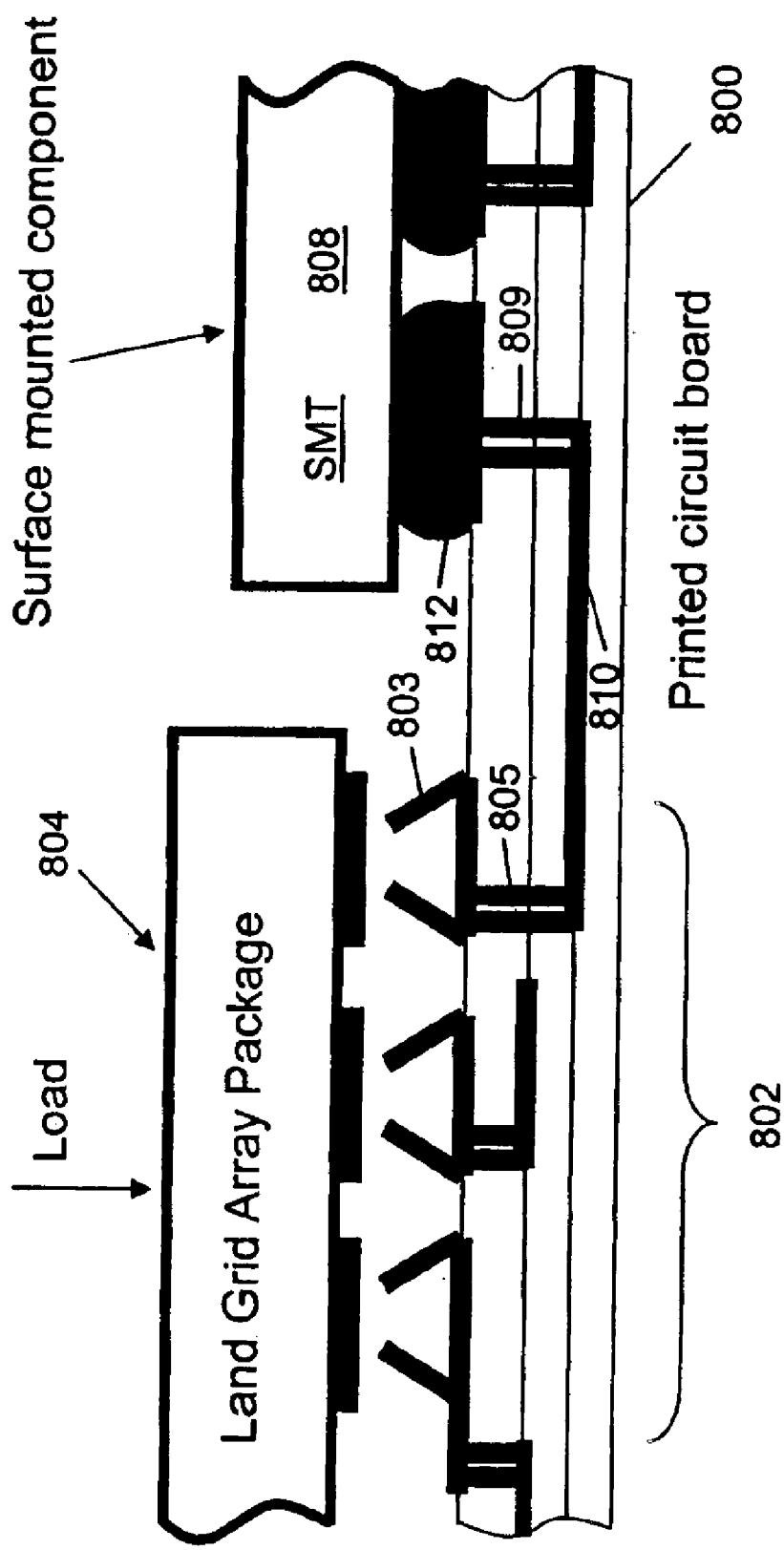
FIG. 15 is a cross-sectional view of a printed circuit board incorporating a contact grid array according to one embodiment of the present invention.

FIG. 15 is a cross-sectional view of a printed circuit board incorporating a contact grid array according to one embodiment of the present invention. Referring to FIG. 15, an array of contact elements 802, or a contact grid array 802, is integrated into a printed circuit board 800. The contact grid array 802 can be used to engage an LGA package or an LGA module without requiring the use of an LGA connector. Furthermore, individual contact elements can be coupled to the respective connection on printed circuit board 800 using conventional PCB technologies. For example, contact element 803 is connected to a solder bump lead 812 of a surface mounted component 808 through a via 805, a metal trace 810 and another via 809.

Contact grid array 802 formed on PC board 800 can be customized as described above to provide the desired operating properties. For example, the contact grid array can be formed to include contact elements having different operating properties, or the contact grid array can be circuitized to include electrical components, or the contact grid array can be formed to include thermally conductive planes. Finally, the contact grid array can also be formed to incorporate one or more coaxial contact elements.

Figure 16:
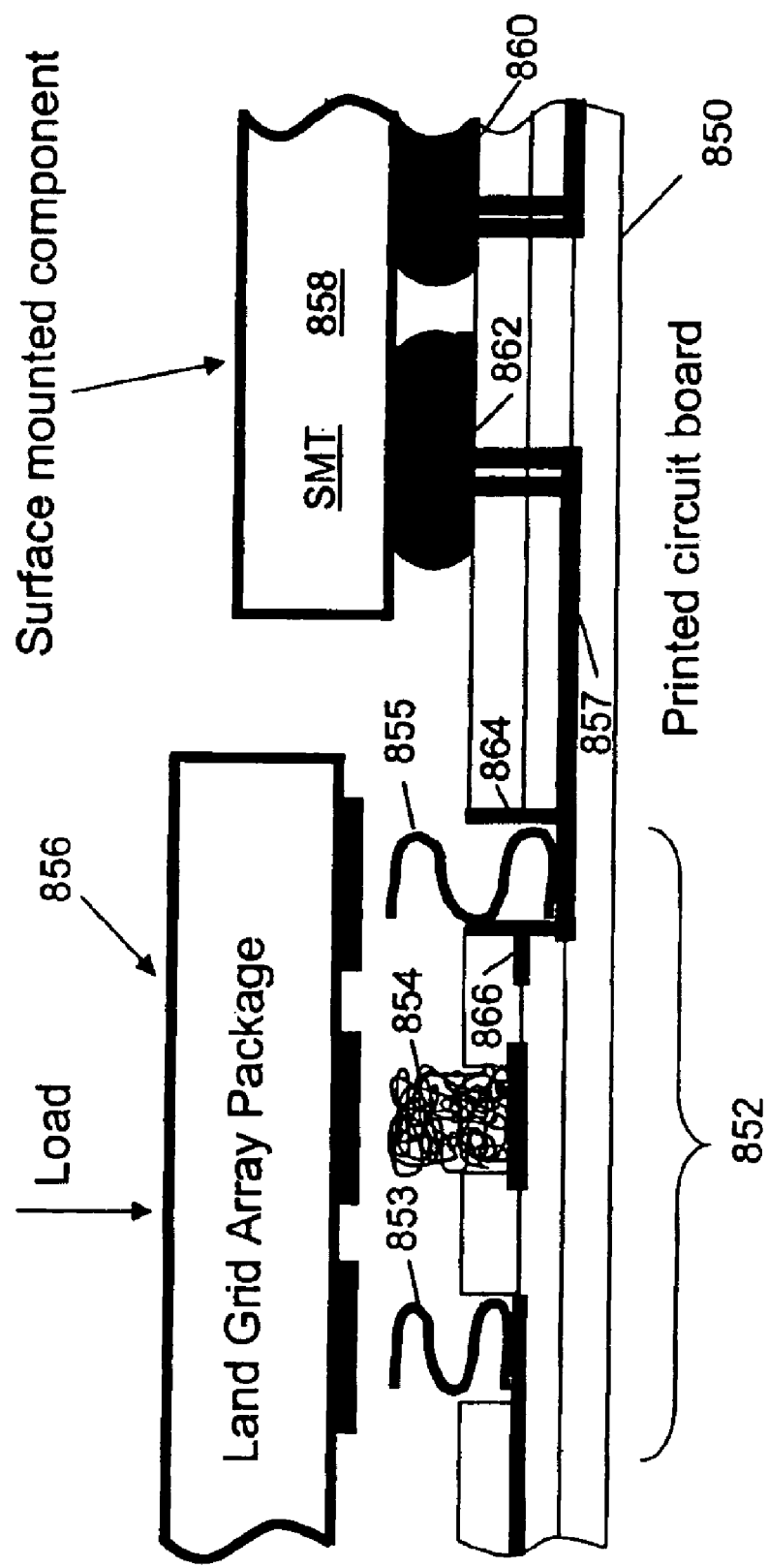
FIG. 16 is a cross-sectional view of a printed circuit board incorporating a contact grid array according to another embodiment of the present invention.

FIG. 16 is cross-sectional view of a printed circuit board incorporating a contact grid array according to another embodiment of the present invention. Referring to FIG. 16, a PC board 850 includes a contact grid array 852. In the present illustration, contact grid array 852 includes a contact element 852 formed using a metal spring, a contact element 854 formed using bundled wire, and a contact element 855 formed using a metal spring. Contact grid array 852 can be used to connect to LGA package 856. Furthermore, contact grid array 852 provides a separable or remountable connection whereby LGA package 856 can be removed and remated. FIG. 16 illustrates that the contact grid array of the present invention can be formed using other types of contact elements and also using a variety of contact elements. That is, contact grid array 852 does not have to be formed using the same type of contact elements. Furthermore, in addition to making electrical contact to the printed circuit board at the bottom of the contact element, the contact elements can make electrical contact with metallized sidewalls 864 in the circuit board. These sidewalls can be used to route electrical current to different layers in the circuit board 866.

Incorporating a contact grid array in a PC board in accordance with the present invention provides many advantages. First, individual contact elements can be circuitized so that conductive traces for each contact element can be formed in different layers of the PC board, enabling high degree of integration. For example, as shown in FIG. 14, contact element 855 is formed deeper in PC board 850 and connects to a metal trace 857. Through metal trace 857, contact element 855 is connected to a lead of a surface mount component 858. In the present illustration, surface mount component 858 is a ball grid array and is attached to pads 860 and 862 of PC board 850. Second, the overall electrical path length can be reduced by removing the interposer. Reducing the overall electrical path length generally reduces resistance and inductance, and improves signal integrity. Similarly, the overall cost can be reduced by removing the interposer and reducing the number of components. The contact elements can be reworked individually during assembly, if required, such that a single poor contact element does not require the replacement of the entire array. Furthermore, the profile of the connector can be reduced to allow the mounted LGA component to lie closer to the surface of the printed circuit board. This is particularly advantageous in mobile applications and other applications in which there are restrictions on the overall system height.

The above detailed descriptions are provided to illustrate specific embodiments of the present invention and are not intended to be limiting. Numerous modifications and variations within the scope of the present invention are possible. For example, one of ordinary skill in the art would appreciate that references to the "top" and "bottom" surfaces of the dielectric substrate are illustrative only and the "top" and "bottom" references are merely used to refer to the two opposing major surfaces of the dielectric substrate. Furthermore, while the above description refers to the use of the connector of the present invention for connecting to land grid array packages, one of ordinary skill in the art would appreciate that the connector of the present invention can be used as an interconnect for any types of area array formed using pads or lands as the electrical connections or the leads. The references to land grid array packages are illustrative only. The present invention is defined by the appended claims.

We claim:

1. An electrical connector for electrically connecting to contacts of a land grid array formed on an electronic component, the connector comprising:
   a dielectric layer including opposing first and second surfaces; and
   a plurality of circumferential contact elements, preformed in an array in a sheet of conductive spring material, the circumferential contact elements including generally opposed elastic portions that are displaced outwardly from the sheet and extending inwardly toward a center of the circumferential contact elements, the sheet being bonded to the first surface such that the elastic portions extend outwardly above the first surface of the dielectric layer, each of the circumferential contact elements comprising a base portion of conductive material that is singulated from the base portions of adjacent ones of the circumferential contact elements, and the elastic portions of conductive material are formed integrally with the base portion,
   the plurality of circumferential contact elements comprising a first group of contact elements and a second group of contact elements, the first group of contact elements having an operating property based on a formation thereof in the sheet that is different than an operating property of the second group of contact elements.

2. The electrical connector of claim 1, further comprising the first group of contact elements being selectively masked, and a layer of material being deposited only on the second group of contact elements.

3. The electrical connector of claim 1, in which the first group of contact elements comprises a first metal composition and the second group of contact elements comprises a second metal composition.

4. The electrical connector of claim 1, further comprising the first group of contact elements protruding a first distance above the first surface, and the second group of contact elements protruding a second distance above the first surface that is different than the first distance.

5. The electrical connector of claim 1, further comprising the elastic portions of the contact elements of the first group having a first length and the elastic portions of the contact elements of the second group having a second length, different from the first length, and each elastic portion having an elastic working range on an order of the first or second length of the elastic portion of the respective contact element to allow staggered contact with the land grid array during installation or removal.

6. The electrical connector of claim 5, further comprising the elastic portions of the first group of contact elements extending linearly.

7. The electrical connector of claim 6, further comprising the elastic portions of the second group of contact elements extending non-linearly.

8. The electrical connector of claim 5, further comprising the elastic portions of the second group of contact elements extending non-linearly.

9. An electrical connector for electrically connecting to contacts of a land grid array formed on an electronic component, the connector comprising:

a dielectric layer including opposing first and second surfaces; and a plurality of contact elements, pre-formed in an array in a sheet of conductive spring material, the contact elements including generally opposed elastic portions that are displaced outwardly from the sheet, the sheet being bonded to the first surface such that the elastic portions extend outwardly above the first surface of the dielectric layer, each of the contact elements comprising a base portion of conductive material that is singulated from the base portions of adjacent ones of the contact elements, and the elastic portions of conductive material are formed integrally with the base portion, the plurality of contact elements comprising a first group of contact elements and a second group of contact elements, the first group of contact elements having an operating property based on a formation thereof in the sheet that is different than an operating property of the second group of contact elements, the elastic portions of the contact elements of the first group having a first length and the elastic portions of the contact elements of the second group having a second length, different from the first length, and each elastic portion having an elastic working range on an order of the first or second length of the elastic portion of the respective contact element to allow staggered contact with the land grid array during installation or removal.

10. The electrical connector of claim 9, further comprising the elastic portions of the first group of contact elements extending linearly.

11. The electrical connector of claim 10, further comprising the elastic portions of the second group of contact elements extending non-linearly.

12. The electrical connector of claim 9, further comprising the elastic portions of the second group of contact elements extending non-linearly.

* * * * *